United States Patent
Jang et al.

(10) Patent No.: US 10,638,625 B2
(45) Date of Patent: Apr. 28, 2020

(54) SOLID STATE DRIVE APPARATUS AND DATA STORAGE SYSTEM HAVING THE SAME

(71) Applicant: Samsung Electronics Co., Ltd., Suwon-si, Gyeonggi-do (KR)

(72) Inventors: Myung-ryul Jang, Suwon-si (KR); Teck-su Oh, Anyang-si (KR); Su-in Kim, Seoul (KR); Ji-yong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/045,045

(22) Filed: Jul. 25, 2018

(65) Prior Publication Data
US 2019/0215972 A1 Jul. 11, 2019

(30) Foreign Application Priority Data
Jan. 5, 2018 (KR) .................. 10-2018-0001683

(51) Int. Cl.
*H05K 5/00* (2006.01)
*H05K 5/02* (2006.01)
(Continued)

(52) U.S. Cl.
CPC ............. *H05K 5/0213* (2013.01); *G06F 1/16* (2013.01); *G06F 1/181* (2013.01); *G06F 1/182* (2013.01);
(Continued)

(58) Field of Classification Search
None
See application file for complete search history.

(56) References Cited

U.S. PATENT DOCUMENTS 6,185,097 B1 * 2/2001 Behl .................. G06F 1/20
361/695
6,856,489 B2 * 2/2005 Hawwa ............... G11B 5/54
360/234
(Continued)

FOREIGN PATENT DOCUMENTS

CN 201533475 7/2010

OTHER PUBLICATIONS

Extended European Search Report for corresponding EP Application No. 18203160.9 dated Mar. 28, 2019, 8 pages.
(Continued)

*Primary Examiner* — Jinhee J Lee
*Assistant Examiner* — Rashen E Morrison
(74) *Attorney, Agent, or Firm* — Myers Bigel, P.A.

(57) ABSTRACT

A solid state drive apparatus includes a housing having an inner space and a plurality of vent channels penetrating a first side wall at a first side of the housing and a connector opening penetrating a second side wall at a second side of the housing opposite the first side of the housing, and a package substrate module in the inner space and having a package base substrate and a plurality of semiconductor chips mounted on the package base substrate. Each of the plurality of vent channels extends inwardly from an outer surface of the first side wall to an inner surface of the first side wall such that a vertical level of at least a portion of each of the plurality of vent channels varies between the outer surface and the inner surface.

19 Claims, 11 Drawing Sheets

(51) Int. Cl.
   *H05K 7/20* (2006.01)
   *H05K 1/14* (2006.01)
   *H05K 1/18* (2006.01)
   *G06F 1/16* (2006.01)
   *G06F 1/18* (2006.01)
   *G06F 1/20* (2006.01)

(52) U.S. Cl.
   CPC .............. *G06F 1/187* (2013.01); *G06F 1/20* (2013.01); *H05K 1/141* (2013.01); *H05K 1/181* (2013.01); *H05K 5/0021* (2013.01); *H05K 5/0247* (2013.01); *H05K 7/20172* (2013.01); *H05K 2201/049* (2013.01); *H05K 2201/10159* (2013.01); *H05K 2201/10522* (2013.01)

(56) References Cited

U.S. PATENT DOCUMENTS

| | | | | |
|---|---|---|---|---|
| 7,301,776 B1* | 11/2007 | Wang | ............. | G06F 12/1416 360/137 |
| 7,830,660 B2* | 11/2010 | Kang | ............. | G02F 1/133385 165/185 |
| 7,924,563 B2* | 4/2011 | Kobayashi | ............. | G06F 1/203 361/694 |
| 8,147,072 B2* | 4/2012 | Lin | ............. | G03B 21/16 353/52 |
| 8,243,445 B2* | 8/2012 | Hasegawa | ............. | H05K 7/20136 174/16.1 |
| 8,934,255 B2* | 1/2015 | Bang | ............. | H05K 7/1432 361/728 |
| 9,084,375 B2* | 7/2015 | Hughes | ............. | H05K 7/20727 |
| 9,332,672 B2* | 5/2016 | Horng | ............. | G06F 1/28 |
| 9,399,999 B2* | 7/2016 | Horng | ............. | F04D 17/16 |
| 9,684,345 B2* | 6/2017 | Choi | ............. | H05K 7/20445 |
| 2001/0013640 A1* | 8/2001 | Tao | ............. | H01L 23/04 257/667 |
| 2007/0127210 A1* | 6/2007 | Mahalingam | ............. | G06F 1/20 361/700 |
| 2008/0130135 A1* | 6/2008 | Shigetoshi | ............. | G02B 7/102 359/701 |
| 2008/0150159 A1* | 6/2008 | Aberin | ............. | H01L 21/563 257/778 |
| 2008/0212297 A1* | 9/2008 | Ni | ............. | G06F 12/1416 361/760 |
| 2009/0268403 A1* | 10/2009 | Chen | ............. | G06F 1/203 361/692 |
| 2011/0199748 A1* | 8/2011 | Kagawa | ............. | H05K 7/20436 361/796 |
| 2011/0249401 A1* | 10/2011 | Yamaguchi | ............. | G06F 1/20 361/697 |
| 2011/0286173 A1* | 11/2011 | Moore | ............. | G06F 1/187 361/679.31 |
| 2012/0319245 A1* | 12/2012 | Low | ............. | H01L 21/565 257/618 |
| 2013/0088869 A1* | 4/2013 | Yun | ............. | F21V 31/03 362/249.01 |
| 2013/0250515 A1* | 9/2013 | Wu | ............. | H05K 7/20145 361/692 |
| 2014/0017843 A1* | 1/2014 | Jung | ............. | B81C 1/00269 438/51 |
| 2014/0020852 A1* | 1/2014 | Thielemann | ............. | F04D 25/0606 160/127 |
| 2014/0140001 A1 | 5/2014 | Gerken et al. | | |
| 2015/0331460 A1 | 11/2015 | Mataya et al. | | |
| 2015/0348593 A1* | 12/2015 | Mundt | ............. | G06F 1/187 360/99.16 |
| 2016/0102951 A1* | 4/2016 | Cole | ............. | F41H 5/24 361/679.34 |
| 2016/0153648 A1* | 6/2016 | Lee | ............. | F21V 29/763 362/249.01 |
| 2016/0270205 A1* | 9/2016 | Kamimura | ............. | H05K 1/0203 |
| 2017/0060199 A1* | 3/2017 | Kim | ............. | G06F 1/20 |

OTHER PUBLICATIONS

Search Report and Written Opinion from the Intellectual Property Office of Singapore for corresponding SG application No. 10201809507X, dated Jul. 30, 2019, 9 pages.

* cited by examiner

SOLID STATE DRIVE APPARATUS AND DATA STORAGE SYSTEM HAVING THE SAME

CROSS-REFERENCE TO RELATED APPLICATION

This application claims the benefit of Korean Patent Application No. 10-2018-0001683, filed on Jan. 5, 2018, in the Korean Intellectual Property Office, the disclosure of which is incorporated by reference herein in its entirety.

BACKGROUND

The inventive concept relates to a solid state drive apparatus and a data storage system having the same, and more particularly, to a solid state drive apparatus including a housing having vent holes, and a data storage system having the solid state drive apparatus.

Solid state drive apparatuses are gaining attention as a next-generation storage device to replace hard disk drives. The solid state drive apparatuses are storage devices based on a non-volatile memory and have low power consumption and a high storage density. In addition, solid state drive apparatuses used as a storage device allow for the input and output of a large amount of data at a high speed, and thus, a higher demand for the solid state drive apparatuses is expected.

Accordingly, data storage systems having a solid state drive apparatus are also being developed. However, as the capacity of the solid state drive apparatuses increases, heat generation also increases.

SUMMARY

The inventive concept provides a solid state drive apparatus having increased reliability by maximizing heat dissipation, and a data storage system having the solid state drive apparatus.

According to an aspect of the inventive concept, there is provided a solid state drive apparatus including: a housing having an inner space and a plurality of vent channels penetrating a first side wall at a first side of the housing and a connector opening penetrating a second side wall at a second side of the housing opposite the first side of the housing; and a package substrate module in the inner space and having a package base substrate and a plurality of semiconductor chips mounted on the package base substrate. Each of the plurality of vent channels extends inwardly from an outer surface of the first side wall to an inner surface of the first side wall such that a vertical level of at least a portion of each of the plurality of vent channels varies between the outer surface and the inner surface.

According to another aspect of the inventive concept, there is provided a solid state drive apparatus including: a housing defining an inner space and a plurality of vent channels defined in a first side wall at a first side of the housing and a connector opening defining in a second side wall at a second side of the housing opposite the first side of the housing; a first package substrate module in the inner space and including a first package base substrate and a plurality of first memory semiconductor chips and at least one controller chip mounted on the first package base substrate; and a second package substrate module in the inner space and including a second package base substrate and a plurality of second memory semiconductor chips mounted on the second package base substrate. Each of the plurality of vent channels extends inwardly and upwardly from an outer surface of the first side wall to an inner surface of the first side wall.

According to another aspect of the inventive concept, there is provided a data storage system including a solid state drive apparatus, including: a main board; a plurality of solid state drive apparatuses each including a housing having an inner space and a plurality of vent holes penetrating a first side wall at a first side of the housing and a connector opening penetrating a second side wall at a second side of the housing opposite the first side of the housing, a package substrate module in the inner space and having a package base substrate and a plurality of semiconductor chips mounted on the package base substrate, wherein the second side wall faces the main board and is connected to the main board; and at least one cooling fan arranged adjacent to the first side wall of each of the plurality of solid state drive apparatuses. For each of the plurality of solid state drive apparatuses, each of the plurality of vent holes extends inwardly from an outer surface of the first side wall to an inner surface of the first side wall such that a vertical level of at least a portion of each of the plurality of vent holes varies between the outer surface and the inner surface.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

As used herein, the term "and/or" includes any and all combinations of one or more of the associated listed items. Expressions such as "at least one of," when preceding a list of elements, modify the entire list of elements and do not modify the individual elements of the list.

Figure 1A:
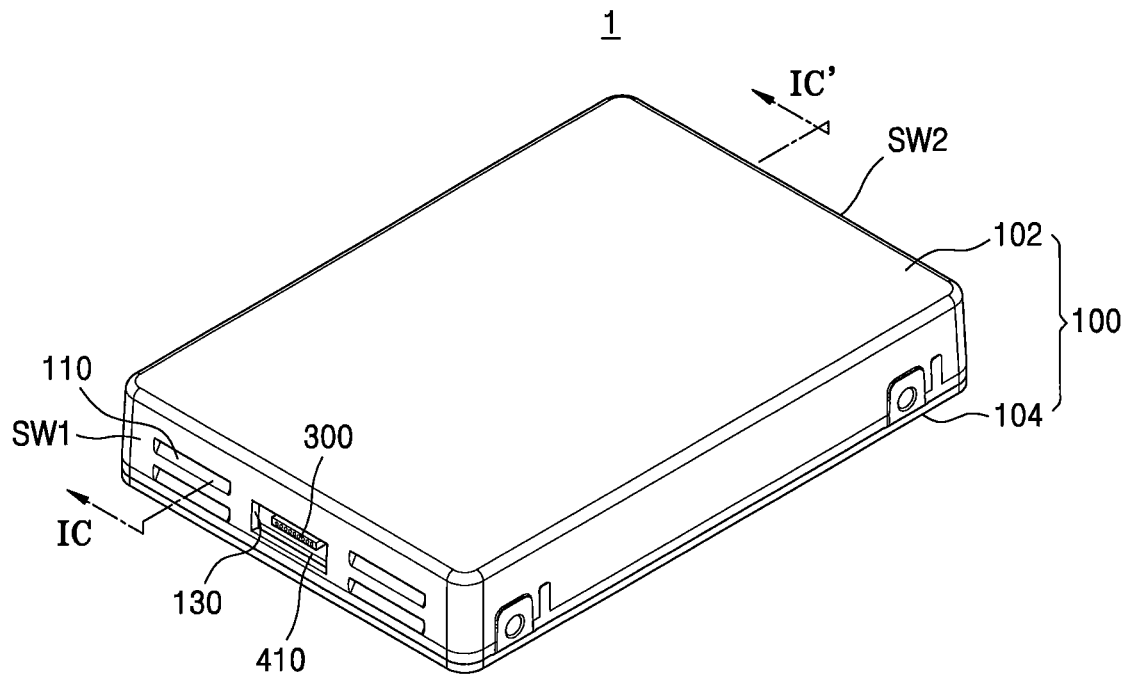
FIGS. 1A and 1B are perspective views from different directions of a solid state drive apparatus according to an embodiment of the inventive concept.
Figure 1B:
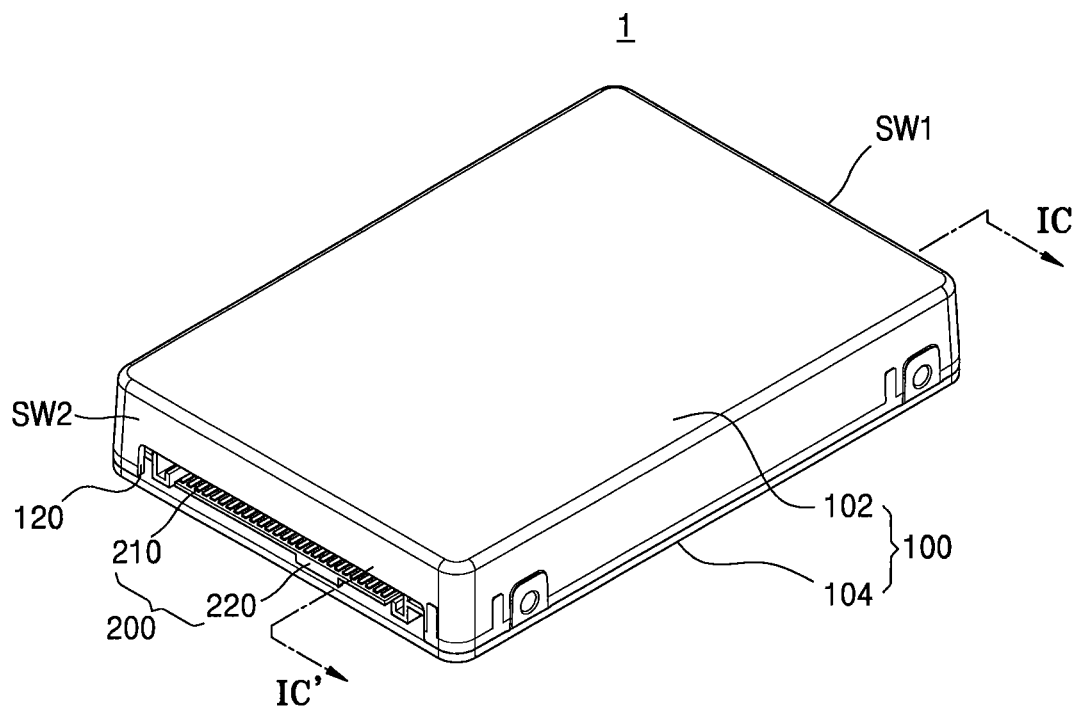
Figure 1C:
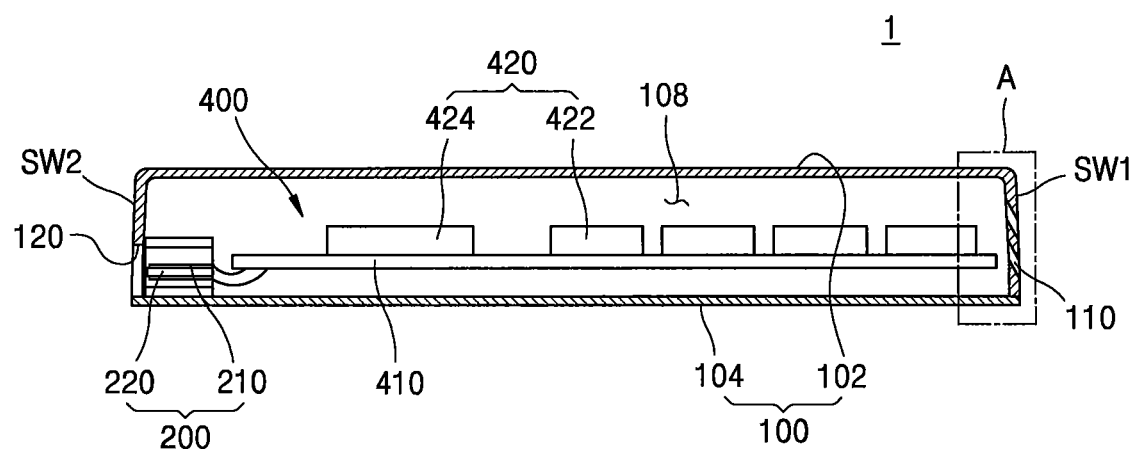
FIG. 1C is a cross-sectional view illustrating the solid state drive apparatus taken along line IC-IC' of FIGS. 1A and 1B.
Figure 1D:
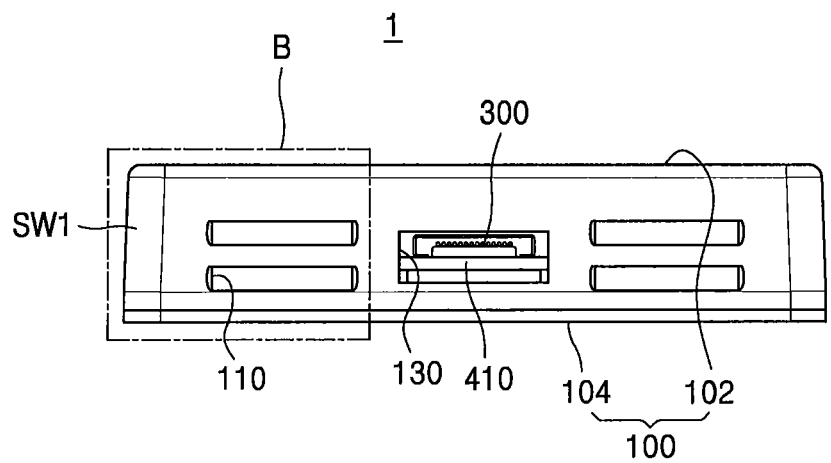
FIG. 1D is a side view of the solid state drive apparatus according to an embodiment of the inventive concept.

FIGS. 1A and 1B are perspective views from different directions of a solid state drive apparatus 1 according to an embodiment of the inventive concept. FIG. 1C is a cross-sectional view illustrating the solid state drive apparatus 1 according to an embodiment of the inventive concept. FIG. 1D is a side view of the solid state drive apparatus 1 according to an embodiment of the inventive concept. In detail, FIG. 1C is a cross-sectional view cut along line IC-IC' of FIGS. 1A and 1B.

Referring to FIGS. 1A through 1D, the solid state drive apparatus 1 includes a housing 100 and a package substrate module 400 mounted in the housing 100.

The housing 100 may be formed of a single material or different materials combined with one another considering heat transfer characteristics. The housing 100 may be formed of a metal, a carbon-based material, a polymer material, or a combination thereof, but is not limited thereto. The housing 100 may be formed of, for example, copper (Cu), aluminum (Al), zinc (Zn), tin (Sn), stainless steel or a clad metal including these. Alternatively, the housing 100 may be formed of, for example, graphite, graphene, carbon fiber, carbon nanotube (CNT) composite, or the like. Alternatively, the housing 100 may be formed of a polymer material such as epoxy resin, polymethylmethacrylate (PMMA), polycarbonate (PC), polyethylene (PE), or the like.

The housing 100 may include an upper cover 102 and a lower cover 104 coupled to the upper cover 102. The housing 100 may include an inner space or cavity 108 which is defined or enclosed by the upper cover 102 and the lower cover 104 and in which the package substrate module 400 is received.

The housing 100 may have a first side wall SW1 and a second side wall SW2 which are opposite to each other. In this specification, most portions of the first side wall SW1 and the second side wall SW2 are shown as portions of the upper cover 102. However, the inventive concept is not limited thereto, and various modifications in the form may be made by one of ordinary skill in the art such that most portions of the first side wall SW1 and the second side wall SW2 of the housing 100 are portions of the lower cover 104 or the first side wall SW1 and the second side wall SW2 of the housing 100 are respectively a portion of the upper cover 102 and a portion of the lower cover 104. However, for convenience of description, the present description will focus on an embodiment where most portions of the first side wall SW1 and the second side wall SW2 are portions of the upper cover 102.

The housing 100 may have a plurality of vent holes or channels 110 defined in the first side wall SW1. The plurality of vent holes 110 may penetrate the first side wall SW1 so as to communicate the outside of the housing 100 with the inner space 108. In other words, the inner space 108 and the area outside of the housing 100 may be in fluid communication via the vent holes 110. The plurality of vent holes 110 may be formed to penetrate, for example, the upper cover 102. The plurality of vent holes 110 may be formed to extend in an oblique direction or at an oblique angle with respect to each of an upper surface of the housing 100 and a surface of the first side wall SW1. A vertical cross-section of each of the plurality of vent holes 110 may be, for example, a bar shape, but is not limited thereto. For example, the vertical cross-section of each of the plurality of vent holes 110 may have various shapes such as a circle, an ellipse, and a rectangle.

The plurality of vent holes 110 will be described in greater detail with reference to FIGS. 2A to 2C.

The housing 100 may have a connector groove or opening 120 defined in the second side wall SW2. The connector groove 120 may penetrate the second side wall SW2 so as to communicate the outside of the housing 100 with the inner space 108. The connector groove 120 may be formed to pass through, for example, the upper cover 102. An external connector 200 connected to the package substrate module 400 may be disposed in the connector groove 120.

The external connector 200 may include a terminal portion 210 electrically connected to the package substrate module 400 and a connector body portion 220 supporting the terminal portion 210. The external connector 200 may connect the solid state drive apparatus 1 with an external host to exchange signals and/or receive power. The external connector 200 may be configured to be connectable to an external device in accordance with, for example, a parallel advanced technology attachment (PATA) standard, a serial advanced technology attachment (SATA) standard, a small computer system interface (SCSI) standard, or a PCI Express (PCIe) Connector. The SATA standard covers not only SATA-1 but also all SATA-related standards such as SATA-2, SATA-3, and external SATA (e-SATA). The PCIe standard covers not only PCIe 1.0, but also all PCIe family standards such as PCIe 2.0, PCIe 2.1, PCIe 3.0, and PCIe 4.0. The SCSI standard encompasses all SCSI family standards such as parallel SCSI, serial-attached SA-SCSI (SAS), and iSCSI. In some embodiments, the external connector 200 may be a connector configured to support an M2 interface, an mSATA interface, or a 2.5" interface.

The package substrate module 400 may include a package base substrate 410 and a plurality of semiconductor chips 420 mounted on the package base substrate 410. The package substrate module 400 may be or include, for example, a single in-line memory module (SIMM) mounted on an upper surface of the package base substrate 410, but is not limited thereto. The package substrate module 400 may be or include, for example, a dual in-line memory module (DIMM) mounted on each of upper and lower surfaces of the package base substrate 410.

A method of mounting the plurality of semiconductor chips 420 on the package base substrate 410 may be a ball grid array (BGA) method, a pin grid array (PGA) method, a tape carrier package (TCP) method, a chip-on-board (COB) method, a quad flat no-lead (QFN) method, a quad flat package (QFP) method, but is not limited thereto.

In some embodiments, the package base substrate 410 may be a printed circuit board. For example, the package base substrate 410 may be a double-sided printed circuit board or a multi-layer printed circuit board. The package base substrate 410 may include a substrate base formed of at least one material selected from a phenol resin, an epoxy resin, and polyimide. The substrate base may be formed of at least one material selected from a phenol resin, an epoxy resin, and polyimide. The substrate base may be formed of, for example, Frame Retardant 4 (FR4), tetrafunctional epoxy, polyphenylene ether, epoxy/polyphenylene oxide, bismaleimide triazine (BT), thermount, a cyanate ester, polyimide, and a liquid crystal polymer.

The package base substrate 410 may have a wiring pattern formed on upper and lower surfaces of the substrate base. In some embodiments, when the substrate base includes a plurality of layers, the wiring pattern may be formed between each of the plurality of layers of the substrate base. A conductive via connecting the wiring patterns may be formed in the substrate base of the package base substrate 410. The conductive via may penetrate the entire substrate base or a portion of the substrate base to electrically connect the wiring patterns. The wiring patterns and/or the conductive via may be formed of copper, nickel, stainless steel, or beryllium copper.

A solder resist layer may be formed on the upper and lower surfaces of the package base substrate 410 to cover at least a portion of the wiring patterns disposed on the upper and lower surfaces of the substrate base. A portion of the wiring patterns disposed on the upper and lower surfaces of the substrate base and not covered by the solder resist layer may be used as a pad to be electrically connected with the plurality of semiconductor chips 420, an active element or a passive element attached to the upper surface and/or lower surface of the package base substrate 410.

The plurality of semiconductor chips 420 may include a plurality of memory semiconductor chips 422 and at least one controller chip 424.

The plurality of memory semiconductor chips 422 and the controller chip 424 may each include a semiconductor substrate. The semiconductor substrate may include, for example, silicon (Si). Alternatively, the semiconductor substrate may include a semiconductor element such as germanium or a compound semiconductor such as silicon carbide (SiC), gallium arsenide (GaAs), indium arsenide (InAs), and indium phosphide (InP). The semiconductor substrate may have an active surface and an inactive surface opposite to the active surface. A semiconductor device including a plurality of individual devices of various kinds on the active surface may be formed in each of the plurality of memory semiconductor chips 422 and the controller chip 424.

The plurality of memory semiconductor chips 422 may be a non-volatile memory device. The non-volatile memory device may be implemented as, for example, a flash memory, phase-change RAM (PRAM), resistive RAM (RRAM), ferroelectric RAM (FeRAM), magnetic RAM (MRAM), and the like, but is not limited thereto. The flash memory may be, for example, a NAND flash memory. The flash memory may be, for example, a V-NAND flash memory. The non-volatile memory device may include one semiconductor die or a stack of several semiconductor dies.

In some embodiments, some of the plurality of memory semiconductor chips 422 may be volatile memory devices.

The volatile memory device may be, for example, DRAM, SRAM, SDRAM, DDR RAM, RDRAM, and the like, but is not limited thereto. The volatile memory device provides a cache function for storing data that is frequently used when the external host accesses the solid state drive apparatus 1, thereby scaling an access time and data transfer performance according to process performance of the external host connected to the solid state drive apparatus 1.

The controller chip 424 may be used to control the plurality of memory semiconductor chips 422. A controller may be mounted in the controller chip 424. The controller may control access to data stored in the nonvolatile memory device. That is, the controller may control write/read operations of the nonvolatile memory device such as a flash memory according to a control command of an external host. The controller may be a separate control semiconductor chip such as an application specific integrated circuit (ASIC). The controller may be designed to be automatically executed by an operating system of the external host when, for example, the solid state drive apparatus 1 is connected to the external host. The controller may provide standard protocols such as PATA, SATA, SCSI, or PCIe. Also, the controller may perform wear leveling, garbage collection, bad block management, and error correcting code (ECC) for the nonvolatile memory device. In this case, the controller may include a script for automatic execution and an application program that may be executed in the external host.

Although not illustrated, the package substrate module 400 may further include an active element or a passive element such as a chip resistor, a chip capacitor, an inductor, a switch, a temperature sensor, a DC-DC converter, a quartz for generating a clock signal or a voltage regulator, which are mounted on the package base substrate 410.

The housing 100 may have a test groove or opening 130 defined in the first side wall SW1. The test groove 130 may penetrate the first side wall SW1 so as to communicate the outside of the housing 100 with the inner space 108. The test groove 130 may be formed to pass through, for example, the upper cover 102. The test groove 130 may be spaced apart from each of the plurality of vent holes 110.

A test connector 300 corresponding to or accessible through the test groove 130 may be mounted on the package base substrate 410. The solid state drive apparatus 1 may be tested through the test connector 300 even when the solid state drive apparatus 1 is connected to an external host via the external connector 200.

Tests will now be briefly described with reference to FIGS. 1 and 11. While the solid state drive apparatus 1 is connected to a main board 700, the test connector 300 corresponds to the test groove 130 of the first side wall SW1 opposite to the second side wall SW2 facing the main board 700. A test on the solid state drive apparatus 1 may be conducted using the test connector 300 without disconnecting the solid state drive apparatus 1 from the main board 700.

Figure 2A:
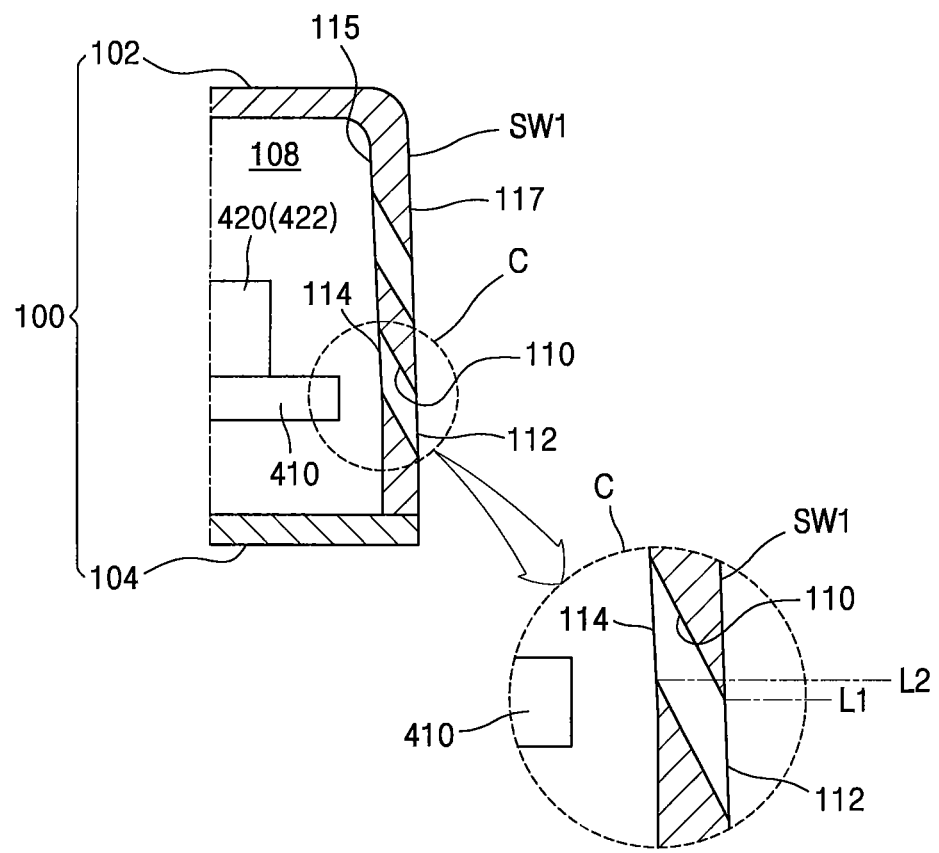
FIG. 2A is an enlarged partial cross-sectional view of a solid state drive apparatus according to an embodiment of the inventive concept.

FIG. 2A is an enlarged partial cross-sectional view of a solid state drive apparatus according to an embodiment of the inventive concept; FIG. 2B is an enlarged partial side view of a solid state drive apparatus according to an embodiment of the inventive concept; and FIG. 2C is an enlarged cross-sectional view of a vent hole of the solid state drive apparatus. In detail, FIG. 2A is an enlarged view of a region A of FIG. 1C; and FIG. 2B is an enlarged view of a portion B of FIG. 1D. In addition, FIG. 2C is a separate enlarged view of a portion C of FIG. 2A.

Figure 2B:
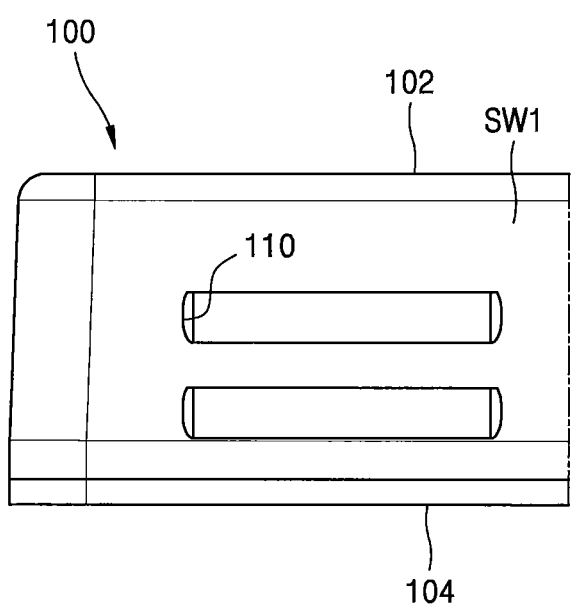
FIG. 2B is an enlarged partial side view of a solid state drive apparatus according to an embodiment of the inventive concept.
Figure 2C:
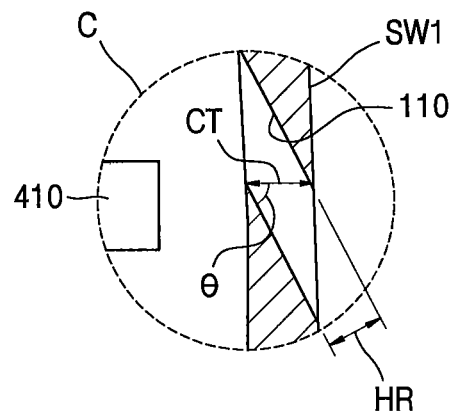
FIG. 2C is an enlarged cross-sectional view of a vent hole of the solid state drive apparatus.

Referring to FIGS. 2A to 2C together, the housing 100 may have a plurality of vent holes or channels 110 defined in the first side wall SW1. The plurality of vent holes 110 may pass through the first side wall SW1 to communicate the outside of the housing 100 with the inner space 108. In other words, the inner space 108 and the area outside of the housing 100 may be in fluid communication via the vent holes 110. The plurality of vent holes 110 may be formed to pass through, for example, the upper cover 102. The plurality of vent holes 110 may extend between an inner surface 115 of the first side wall SW1 and an outer surface 117 of the first side wall SW1. The plurality of vent holes 110 may be formed to extend in an oblique direction or at an oblique angle with respect to each of an upper surface of the housing 100 and a surface of the first side wall SW1 (e.g., the inner surface 115 or the outer surface 117 of the first side wall SW1). Each of the plurality of vent holes 110 may extend while a level of at least a portion of the housing 110 is varied from the outside to the inside of the housing 100. In some embodiments, the plurality of vent holes 110 may be formed to extend from the outside to the inside of the housing 100 in an oblique direction in which a level rises. For example, each vent hole 110 may be inclined and extend upwardly from the outer surface 117 to the inner surface 115 of the first side wall SW1. However, the inventive concept is not limited thereto. For example, the plurality of vent holes 110 may be formed to extend from the outside to the inside of the housing 100 in an oblique direction in which a level decreases. That is, each vent hole 110 may be inclined and extend downwardly from the outer surface 117 to the inner surface 115 of the first side wall SW1.

For example, an inclination (θ) of the housing 100 in an extension direction of the vent holes 110 with respect to a thickness direction of the first side wall SW1 may have a value of arcsin(HR/CT)±5°. Here, CT is a thickness of the first side wall SW1 of the housing 100, and HR is a diameter of the vent holes 110. As used herein, diameter may mean a distance or spacing between an upper end of the vent hole 110 and a lower end of the vent hole 110.

An outer side portion 112 and an inner side portion 114 may be formed at a first or outer side and a second or inner side of each of the plurality of vent holes 110, respectively. The outer side portion 112 and the inner side portion 114 may be portions of the housing 100 adjacent to the vent holes 110 that define the vent holes 110. The outer side portion 112 may be a portion of the housing 100 defining the vent holes 110 outside the housing 100, and the inner side portion 114 may be a portion of the housing 100 defining the vent holes 110 at the inner space 108 of the housing 100. For example, the inner side portion 114 may include the inner surface 115 of the first side wall SW1 and the outer side portion 112 may include the outer surface 117 of the first side wall SW1. In some embodiments, the inner side portion 114 of each of the plurality of vent holes 110 may be overall at a higher level than the outer side portion 112. That is, the inner side portion 114 of each of the plurality of vent holes 110 may be at a higher vertical position on the first side wall SW1 than the outer side portion 112. However, the inventive concept is not limited thereto. For example, the inner side portion 114 of each of the plurality of vent holes 110 may be overall at a lower level than the outer side portion 112. That is, the inner side portion 114 of each of the plurality of vent holes 110 may be at a lower vertical position on the first side wall SW1 than the outer side portion 112.

In detail, the inner side portion 114 located overall at a higher level than the outer side portion 112 indicates that an upper end of the inner side portion 114 has a higher level than an upper end of the outer side portion 112, and a lower end of the inner side portion 114 also has a higher level than a lower end of the outer side portion 112. That is, an upper end of the inner side portion 114 is at a higher vertical position on the first side wall SW1 than an upper end the outer side portion 112, and a lower end of the inner side portion 114 is also at a higher vertical position on the first side wall SW1 than a lower end of the of the outer side portion 112. Likewise, the inner side portion 114 located overall at a lower level than the outer side portion 112 indicates that an upper end of the inner side portion 114 has a lower level than an upper end of the outer side portion 112, and a lower end of the inner side portion 114 also has a lower level than a lower end of the outer side portion 112. That is, an upper end of the inner side portion 114 is at a lower vertical position on the first side wall SW1 than an upper end the outer side portion 112, and a lower end of the inner side portion 114 is also at a lower vertical position on the first side wall SW1 than a lower end of the of the outer side portion 112.

In some embodiments, a first level, height, or vertical position L1, which is a level of the upper end of the outer side portion 112, may be equal to or lower than the second level, height, or vertical position L2, which is a level of the lower end of the inner side portion 114. In this case, an inclination of the vent holes 110 in an extension direction thereof may have a value of about arcsin(HR/CT) to about arcsin (HR/CT)+5°. In some embodiments, in some of the plurality of vent holes 110, the second level L2 may be lower than the upper surface of the package base substrate 410 and higher than the lower surface of the package base substrate 410. For the rest of the plurality of vent holes 110, the second level L2 may be higher than an upper surface of the semiconductor chip 420.

When viewing the first side wall SW1 from the outside of the housing 100 in a horizontal direction, an observer viewing the vent holes 110 from the outside of the housing 100 may observe only an inner surface of the vent holes 110 through the outer side portion 112. Accordingly, the observer may not observe the semiconductor chip 420 located in the inner space 108 of the housing 100 through the vent holes 110.

FIGS. 3A to 6B are modified embodiments of the solid state drive apparatus 1 described with reference to FIGS. 1A to 2C, and common reference numerals of FIGS. 1A to 2C may be referred to together here.

Figure 3A:
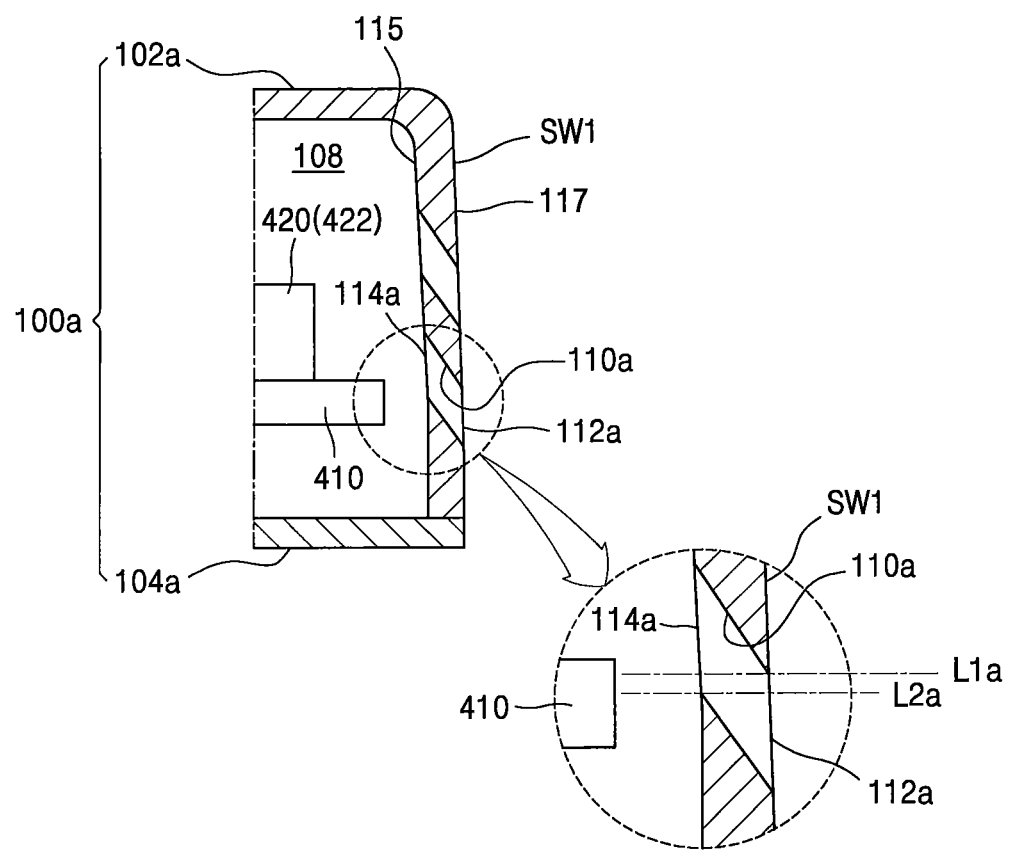
FIG. 3A is an enlarged partial cross-sectional view of a solid state drive apparatus according to an embodiment of the inventive concept.
Figure 3B:
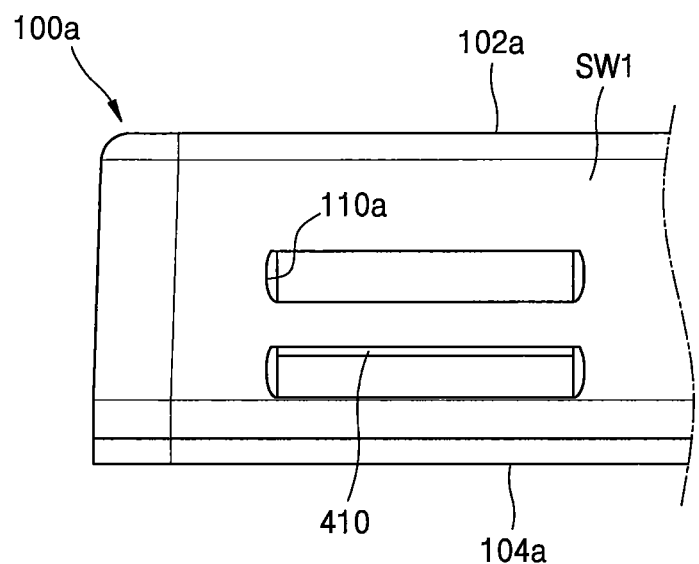
FIG. 3B is an enlarged partial side view of a solid state drive apparatus according to an embodiment of the inventive concept.

FIG. 3A is an enlarged partial cross-sectional view of a solid state drive apparatus according to an embodiment of the inventive concept; and FIG. 3B is an enlarged partial side view of the solid state drive apparatus according to an embodiment of the inventive concept. In detail, FIG. 3A is an enlarged view of a portion corresponding to the region A of FIG. 1C, and FIG. 3B is an enlarged view of a portion corresponding to the portion B of FIG. 1D.

Referring to FIGS. 3A and 3B, a housing 100a may include an upper cover 102a and a lower cover 104a coupled to the upper cover 102a. The housing 100a may have a plurality of vent holes or channels 110a defined in the first side wall SW1. The plurality of vent holes 110a may penetrate the first side wall SW1 and communicate with the inner space 108 with the outside of the housing 100a. In other words, the inner space 108 and the area outside of the housing 100a may be in fluid communication via the vent holes 110a. The plurality of vent holes 110a may be formed to penetrate, for example, the upper cover 102a. The plurality of vent holes 110a may extend between an inner surface 115 of the first side wall SW1 and an outer surface 117 of the first side wall SW1. Each of the plurality of vent holes 110a may extend while a level or vertical position of at least a portion thereof is varied from the outside to the inside of the housing 100. For example, the plurality of vent holes 110a may be formed to extend from the outside to the inside of the housing 100a in an oblique direction or at an oblique angle with respect to each of an upper surface of the housing 100a and a surface of the first side wall SW1 (e.g., the inner surface 115 or the outer surface 117 of the first side wall SW1). In some embodiments, the plurality of vent holes 110a may be formed to extend from the outside to the inside of the housing 100a in an oblique direction in which a level rises. For example, each vent hole 110a may be inclined and extend upwardly from the outer surface 117 to the inner surface 115 of the first side wall SW1.

An outer side portion 112a and an inner side portion 114a may be formed at a first side and a second side of each of the plurality of vent holes 110a, respectively. The outer side portion 112a and the inner side portion 114a may be portions of the housing 100a adjacent to the vent holes 110a and defining the vent holes 110a. The outer side portion 112a may be a portion of the housing 100a defining the vent holes 110a outside the housing 100b, and the inner side portion 114a may be a portion of the housing 100a defining the vent holes 110a at the inner space 108 of the housing 100a. For example, the inner side portion 114a may include the inner surface 115 of the first side wall SW1 and the outer side portion 112a may include the outer surface 117 of the first side wall SW1.

In some embodiments, the inner side portion 114a of each of the plurality of vent holes 110a may be overall at a higher level than the outer side portion 112a. That is, the inner side portion 114a of each of the plurality of vent holes 110a may be at a higher vertical position on the first side wall SW1 than the outer side portion 112a. However, the inventive concept is not limited thereto. For example, the inner side portion 114a of each of the plurality of vent holes 110a may be overall at a lower level than the outer side portion 112a. That is, the inner side portion 114a of each of the plurality of vent holes 110a may be at a lower vertical position on the first side wall SW1 than the outer side portion 112a.

In detail, the inner side portion 114a located overall at a higher level than the outer side portion 112a indicates that an upper end of the inner side portion 114a has a higher level than an upper end of the outer side portion 112a, and a lower end of the inner side portion 114a also has a higher level than a lower end of the outer side portion 112a. That is, an upper end of the inner side portion 114a is at a higher vertical position on the first side wall SW1 than an upper end the outer side portion 112a, and a lower end of the inner side portion 114a is also at a higher vertical position on the first side wall SW1 than a lower end of the of the outer side portion 112a. Likewise, the inner side portion 114a located overall at a lower level than the outer side portion 112a indicates that an upper end of the inner side portion 114a has a lower level than an upper end of the outer side portion 112a, and a lower end of the inner side portion 114a also has a lower level than a lower end of the outer side portion 112a. That is, an upper end of the inner side portion 114a is at a lower vertical position on the first side wall SW1 than an upper end the outer side portion 112a, and a lower end of the inner side portion 114a is also at a lower vertical position on the first side wall SW1 than a lower end of the of the outer side portion 112a.

In some embodiments, a first level, height, or vertical position L1a at the upper end of the outer side portion 112a may have a level higher than a second level, height, or vertical position L2a which is a level of the lower end of the inner side portion 114a. In this case, the inclination (θ) of the vent holes 110a in the extension direction (see FIG. 2C) may have a value of about arcsin(HR/CT) to about arcsin(HR/CT)−5°. CT here denotes a thickness of the first side wall SW1 of the housing 100a, and HR (see FIG. 2C) is a diameter of the vent holes 110a. In some embodiments, the second level L2a in some of the plurality of vent holes 110a may be lower than the upper surface of the package base substrate 410 and higher than the lower surface of the package base substrate 410. The second level L2a may be higher than the upper surface of the semiconductor chip 420 for the rest of the plurality of vent holes 110a.

When viewing the first side wall SW1 from the outside of the housing 100a in a horizontal direction, an observer viewing the vent holes 110a from the outside of the housing 100a may observe only a side surface of the package base substrate 410 or the inner space 108 of the housing 100a through the outer side portion 112a. Accordingly, the observer may not observe the semiconductor chip 420 located in the inner space 108 of the housing 100a through the vent holes 110a.

Figure 4A:
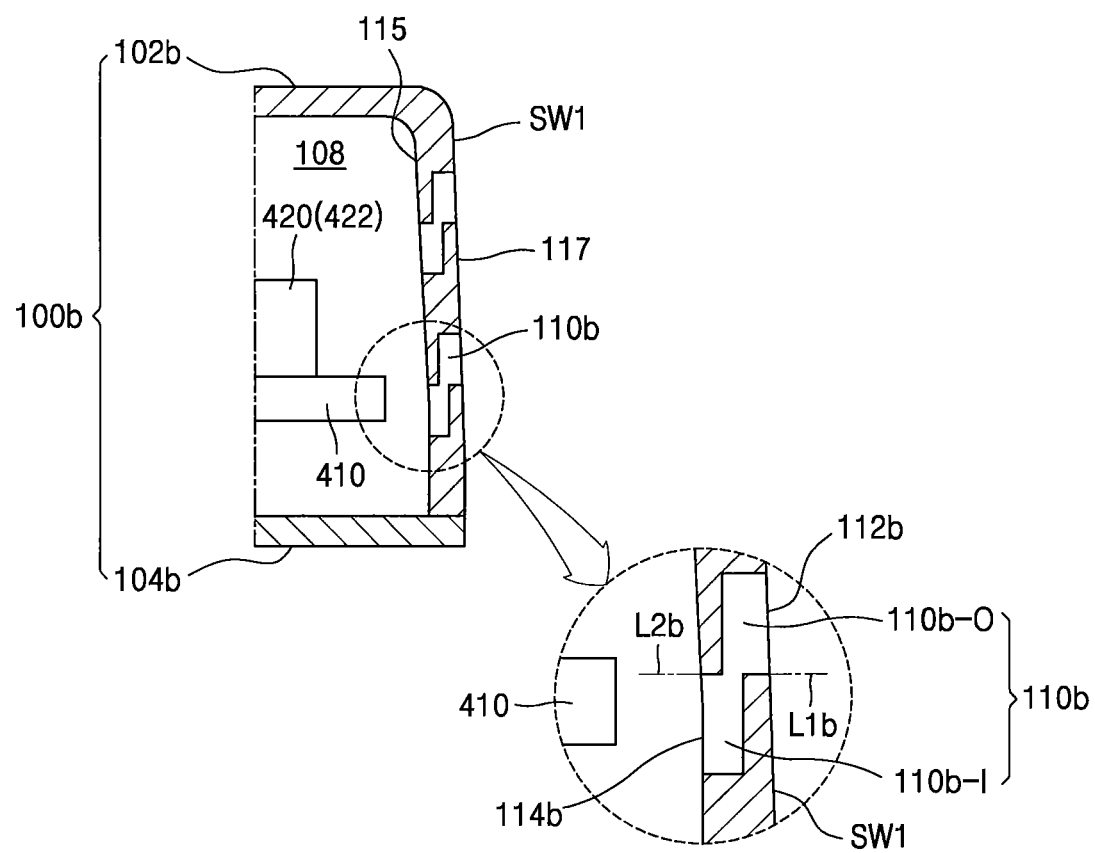
FIG. 4A is an enlarged partial cross-sectional view of a solid state drive apparatus according to an embodiment of the inventive concept.
Figure 4B:
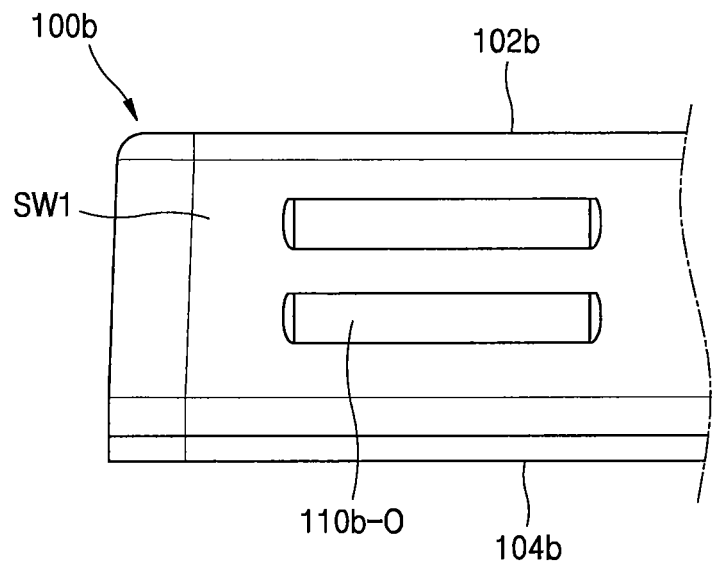
FIG. 4B is an enlarged partial side view of a solid state drive apparatus according to an embodiment of the inventive concept.

FIG. 4A is an enlarged partial cross-sectional view of a solid state drive apparatus according to an embodiment of the inventive concept; and FIG. 4B is an enlarged partial side view of the solid state drive apparatus according to an embodiment of the inventive concept. In detail, FIG. 4A is an enlarged view of a portion corresponding to the region A of FIG. 1C, and FIG. 4B is an enlarged view of a portion corresponding to the portion B of FIG. 1D.

Referring to FIGS. 4A and 4B, a housing 100b may include an upper cover 102b and a lower cover 104b coupled to the upper cover 102b. The housing 100b may have a plurality of vent holes or channels 110b defined in the first side wall SW1. The plurality of vent holes 110b may penetrate the first side wall SW1 and communicate the outside of the housing 100b with the inner space 108. In other words, the inner space 108 and the area outside of the housing 100b may be in fluid communication via the vent holes 110b. The plurality of vent holes 110b may be formed to penetrate, for example, the upper cover 102b. The plurality of vent holes 110b may extend between an inner surface 115 of the first side wall SW1 and an outer surface 117 of the first side wall SW1. Each of the plurality of vent holes 110b may extend from the outside of the housing 100b toward the inside of the housing 100b while a level or height of at least a portion of the plurality of vent holes 110b is varied. Each of the plurality of vent holes 110b may include an inner vent hole 110b-I and an outer vent hole 110b-O that communicate with each other. The inner vent hole 110b-I may inwardly extend into an inner portion of the first side wall SW1 in a horizontal direction from the inner space 108 of the housing 100b, and the outer vent hole 110b-I may inwardly extend into the inner portion of the first side wall SW1 from the outside of the housing 100b such that that the inner vent hole 110b-I and the outer vent hole 110b-O communicate with each other. The inner vent hole 110b-I and the outer vent hole 110b-O of each of the plurality of vent holes 110b may have different levels overall and may inwardly extend into the inner portion of the housing 100b in a horizontal direction from the inside and the outside of the housing 100b. The inner vent hole 110b-I of each vent hole 110b may extend from the inner surface 115 of the first side wall SW1 and the outer vent hole 110b-O of each vent hole 110b may extend from the outer surface 117 of the first side wall SW1.

An outer side portion 112b and an inner side portion 114b may be formed at a first side and a second side of each of the plurality of vent holes 110b, respectively. The outer side portion 112b and the inner side portion 114b may be portions of the housing 100b adjacent to the vent holes 110b and defining the vent holes 110b. The outer side portion 112b may be a portion of the housing 100b defining the vent holes 110b outside the housing 100b, that is, defining the outer vent holes 110b-O, and the inner side portion 114b may be a portion of the housing 100b defining the vent holes 110b at the inner space 108 of the housing 100b, that is, defining the inner vent holes 110b-I. For example, the inner side portion 114b may include the inner surface 115 of the first side wall SW1 and the outer side portion 112b may include the outer surface 117 of the first side wall SW1.

In some embodiments, the inner side portion 114b of each of the plurality of vent holes 110b may be overall at a lower level than the outer side portion 112b. That is, the inner side portion 114b of each of the plurality of vent holes 110b may be at a lower vertical position on the first side wall SW1 than the outer side portion 112b. However, the inventive concept is not limited thereto. For example, the inner side portion 114b of each of the plurality of vent holes 110b may be overall at a higher level than the outer side portion 112b. That is, the inner side portion 114b of each of the plurality of vent holes 110b may be at a higher vertical position on the first side wall SW1 than the outer side portion 112b.

In detail, the inner side portion 114b located overall at a higher level than the outer side portion 112b indicates that an upper end of the inner side portion 114b has a higher level than an upper end of the outer side portion 112b, and a lower end of the inner side portion 114b also has a higher level than a lower end of the outer side portion 112b. That is, an upper end of the inner side portion 114b is at a higher vertical position on the first side wall SW1 than an upper end the outer side portion 112b, and a lower end of the inner side portion 114b is also at a higher vertical position on the first side wall SW1 than a lower end of the of the outer side portion 112b. Likewise, the inner side portion 114b located overall at a lower level than the outer side portion 112b indicates that an upper end of the inner side portion 114b has a lower level than an upper end of the outer side portion 112b, and a lower end of the inner side portion 114b also has a lower level than a lower end of the outer side portion 112b. That is, an upper end of the inner side portion 114b is at a lower vertical position on the first side wall SW1 than an upper end the outer side portion 112b, and a lower end of the inner side portion 114b is also at a lower vertical position on the first side wall SW1 than a lower end of the of the outer side portion 112b.

In some embodiments, a first level, height, or vertical position L1b which is a level of an upper end of the outer side portion 112b and a second level, height, or vertical position L2b which is a level of a lower end of the inner side portion 114b may have the same or substantially the same level as each other. When viewing the first side wall SW1 from the outside of the housing 100b in a horizontal direction, an observer viewing the vent holes 110b from the outside of the housing 100b may observe only a portion of the housing 100b in the outer vent hole 110b-O through the outer side portion 112b. Accordingly, the observer is not able to observe the semiconductor chip 420 located in the inner space 108 of the housing 100b through the vent holes 110b.

In some of the plurality of vent holes 110b, the first level L1b and the second level L2b may be at a level lower than the upper surface of the package base substrate 410 and at a higher level than the lower surface of the package base substrate 410. For the rest of the plurality of vent holes 110b, the first level L1b and the second level L2b may be at a higher level than the upper surface of the semiconductor chip 420.

In other embodiments, the first level L1b which is the level of the upper end of the outer side portion 112b may have a lower level than the second level L2b which is the level of the lower end of the inner side portion 114b. When viewing the first side wall SW1 from the outside of the housing 100b in a horizontal direction, an observer viewing the vent holes 110b from the outside of the housing 100b may observe only a side surface of the package base substrate 410 in the housing 100b or the inner space 108 of the housing 100b through the outer side portion 112b. Accordingly, the observer is not able to observe the semiconductor chip 420 located in the inner space 108 of the housing 100b through the vent holes 110b.

Figure 5A:
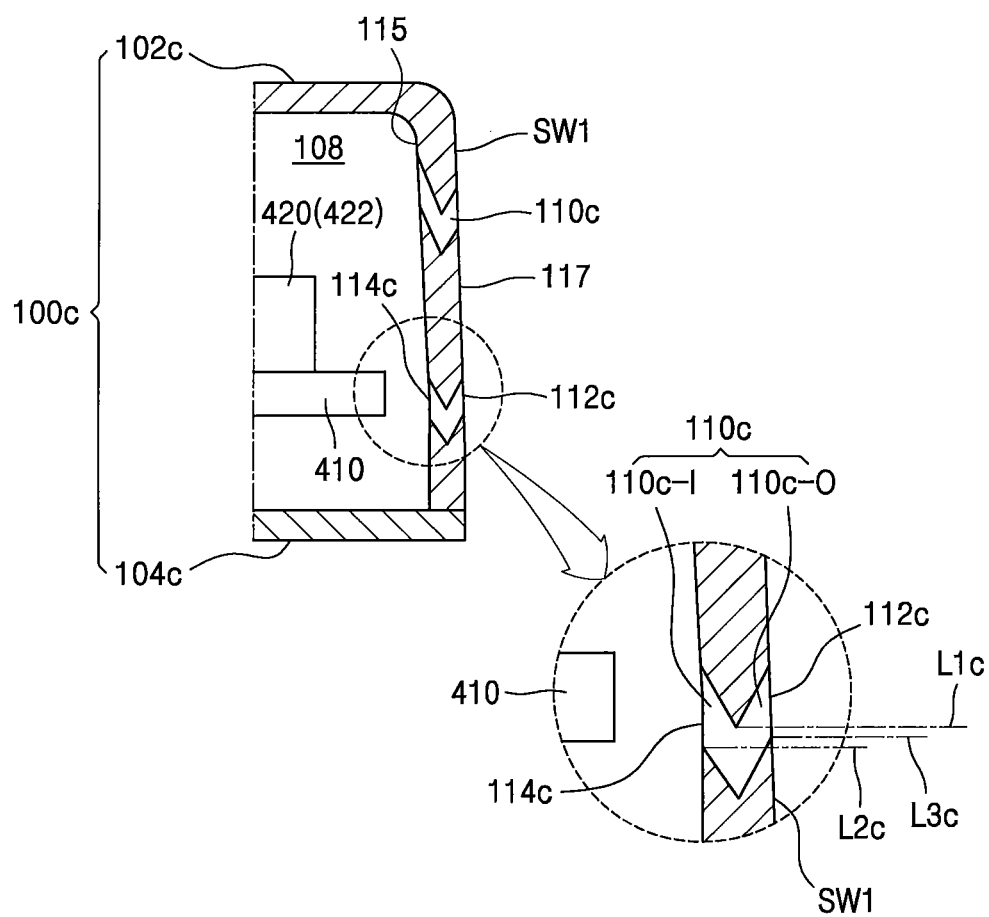
FIG. 5A is an enlarged partial cross-sectional view of a solid state drive apparatus according to an embodiment of the inventive concept.
Figure 5B:
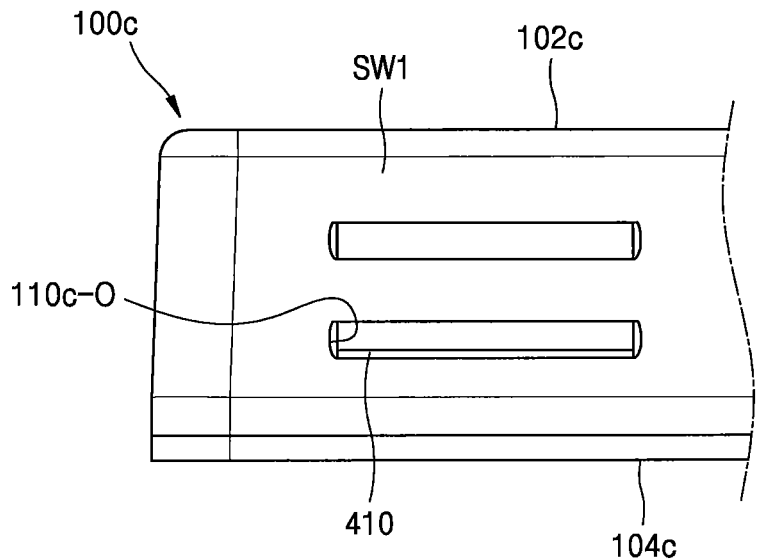
FIG. 5B is an enlarged partial side view of a solid state drive apparatus according to an embodiment of the inventive concept.

FIG. 5A is an enlarged partial cross-sectional view of a solid state drive apparatus according to an embodiment of the inventive concept; and FIG. 5B is an enlarged partial side view of the solid state drive apparatus according to an embodiment of the inventive concept. In detail, FIG. 5A is an enlarged view of a portion corresponding to the region A of FIG. 1C, and FIG. 5B is an enlarged view of a portion corresponding to the portion B of FIG. 1D.

Referring to FIGS. 5A and 5B, a housing 100c may include an upper cover 102c and a lower cover 104c coupled to the upper cover 102c. The housing 100c may have a plurality of vent holes or channels 110c defined in the first side wall SW1. The plurality of vent holes 110c may penetrate the first side wall SW1 and communicate the outside of the housing 100c with the inner space 108. In other words, the inner space 108 and the area outside of the housing 100c may be in fluid communication via the vent holes 110c. The plurality of vent holes 110c may be formed to penetrate, for example, the upper cover 102c. The plurality of vent holes 110c may extend between an inner surface 115 of the first side wall SW1 and an outer surface 117 of the first side wall SW1. Each of the plurality of vent holes 110c may inwardly extend from the outside of the housing 100c while a level or height in at least a portion of the vent holes 110c is varied. Each of the plurality of vent holes 110c may include an inner vent hole 110c-I and an outer vent hole 110c-O that communicate with each other. The inner vent hole 110c-I may extend from the inner space 108 of the housing 100c toward an inner portion of the first side wall SW1 of the housing 100c in an oblique direction or at an oblique angle, and the outer vent hole 110c-I may extend from the outside of the housing 100c toward the inner portion of the first side wall SW1 of the housing 100c in an oblique direction or at an oblique angle such that the inner vent hole 110c-I and the outer vent hole 110c-O communicate with each other. The inner vent hole 110c-I of each vent hole 110c may extend from the inner surface 115 of the first side wall SW1 and the outer vent hole 110c-O of each vent hole 110c may extend from the outer surface 117 of the first side wall SW1.

In some embodiments, the inner vent hole 110c-I of the plurality of vent holes 110c may inwardly extend from the inside of the housing 100c or the inner surface 115 in an oblique direction in which a level decreases, and the outer vent hole 110c-O of the plurality of vent holes 110c may inwardly extend from the outside of the housing 100c or the outer surface 117 in an oblique direction in which a level decreases, so that the vent holes 110c extend from the outside to the inside of the housing 100c in a V-shape.

In some embodiments, the inner vent hole 110c-I of the plurality of vent holes 110c may inwardly extend from the inside of the housing 100c or the inner surface 115 in an oblique direction in which a level rises, and the outer vent hole 110c-O of the plurality of vent holes 110c may inwardly extend from the outside of the housing 100c or the outer surface 117 in an oblique direction in which a level rises, so that the plurality of vent holes 110c have a ^ or inverse V-shape.

An outer side portion 112c and an inner side portion 114c may be formed at a first side and a second side of each of the plurality of vent holes 110c, respectively. The outer side portion 112c and the inner side portion 114c may be portions of the housing 100c adjacent to the vent holes 110c and defining the vent holes 110c. The outer side portion 112c may be a portion of the housing 100c defining the vent holes 110c outside the housing 100c, that is, the outer vent holes 110c-O, and the inner side portion 114c may be a portion of the housing 100c defining the vent holes 110c at the inner space 108 of the housing 100c, that is, the inner vent holes 110c-I. For example, the inner side portion 114c may include the inner surface 115 of the first side wall SW1 and the outer side portion 112c may include the outer surface 117 of the first side wall SW1.

In some embodiments, the inner side portion 114c of each of the plurality of vent holes 110c may be overall at a higher level or vertical position than the outer side portion 112c or at an identical level or vertical position to the outer side portion 112c or at a lower level or vertical position than the outer side portion 112c.

In some embodiments, a first level, height, or vertical position L1c, which is a level of an upper end of the outer side portion 112c, may have a higher level than a third level, height, or vertical position L3c, which is a level of an upper end of the vent holes 110c where the outer vent holes 110c-O and the inner vent holes 110c-I meet, and the third level L3c may have a higher level than a second level, height, or vertical position L2c, which is a level of a lower end of the inner side portion 114c.

When viewing the first side wall SW1 from the outside of the housing 100c in a horizontal direction, an observer viewing the vent holes 110c from the outside of the housing 100c may observe only a side surface of the package base substrate 410 or the inner space 108 of the housing 100c through the outer side portion 112. Accordingly, the observer may not observe the semiconductor chip 420 located in the inner space 108 of the housing 100c through the vent holes 110c.

In another embodiments, when the first level L1c has an identical level to or a lower level than the third level L3c, or the second level L2c has an identical level to or a higher level than the third level L3c, an observer who views the vent holes 110c from the outside of the housing 100c in a horizontal direction may observe only the housing 100c in the inner vent holes 110c-I. Accordingly, the observer may not observe the semiconductor chip 420 located in the inner space 108 in the housing 100c through the vent holes 110c.

Figure 6A:
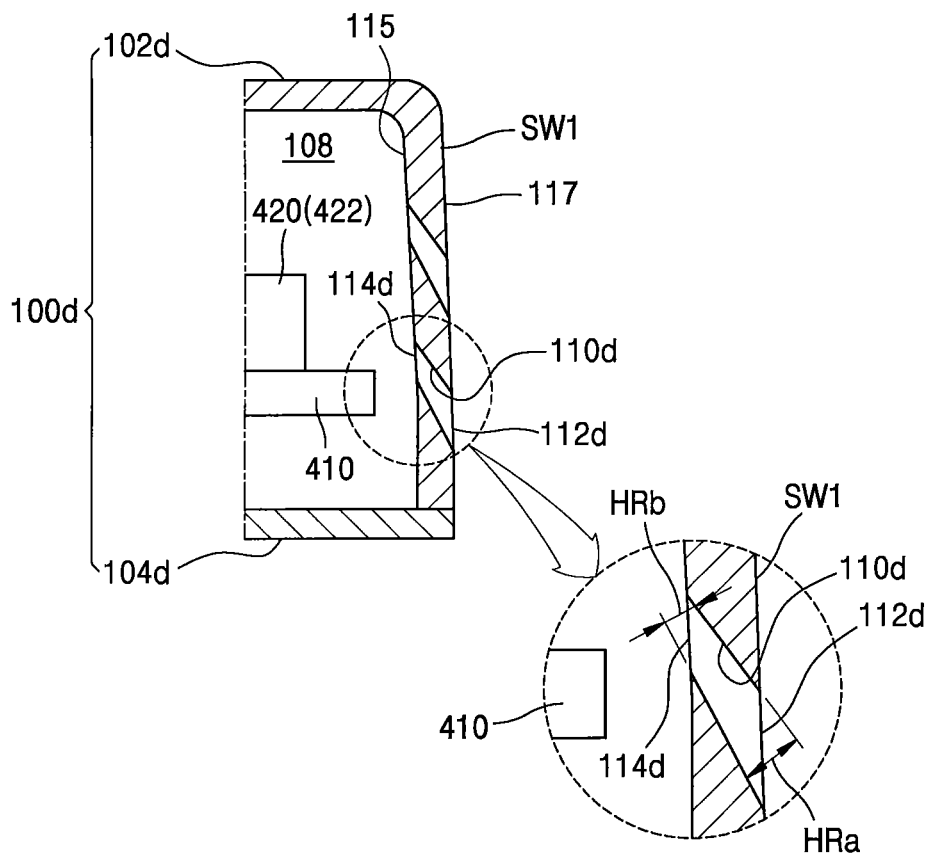
FIG. 6A is an enlarged partial cross-sectional view of a solid state drive apparatus according to an embodiment of the inventive concept.
Figure 6B:
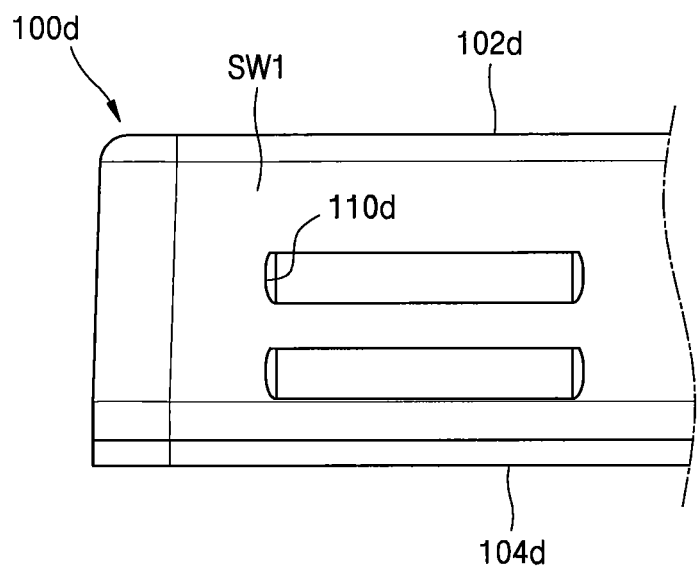
FIG. 6B is an enlarged partial side view of a solid state drive apparatus according to an embodiment of the inventive concept.

FIG. 6A is an enlarged partial cross-sectional view of a solid state drive apparatus according to an embodiment of the inventive concept; and FIG. 6B is an enlarged partial side view of the solid state drive apparatus according to an embodiment of the inventive concept. In detail, FIG. 6A is an enlarged view of a portion corresponding to the region A of FIG. 1C, and FIG. 6B is an enlarged view of a portion corresponding to the portion B of FIG. 1D.

Referring to FIGS. 6A and 6B, a housing 100d may include an upper cover 102d and a lower cover 104d coupled to the upper cover 102d. The housing 100d may have a plurality of vent holes or channels 110d defined in the first side wall SW1. The plurality of vent holes 110d may penetrate the first side wall SW1 and communicate the outside of the housing 100d with the inner space 108. In other words, the inner space 108 and the area outside of the housing 100d may be in fluid communication via the vent holes 110d. The plurality of vent holes 110d may be formed to penetrate, for example, the upper cover 102d. The plurality of vent holes 110d may extend between an inner surface 115 of the first side wall SW1 and an outer surface 117 of the first side wall SW1. Each of the plurality of vent holes 110d may inwardly extend from the outside of the housing 100d while a level or height of at least a portion of the vent holes 110d is varied. The plurality of vent holes 110d may be formed to extend in an oblique direction or at an oblique angle with respect to each of an upper surface of the housing 100d and a surface of the first side wall SW1 (e.g., the inner surface 115 or the outer surface 117). In some embodiments, the plurality of vent holes 110d may be formed so as to extend from the outside to the inside of the housing 100d in an oblique direction in which a level rises. For example, each vent hole 110d may be inclined and extend upwardly from the outer surface 117 to the inner surface 115 of the first side wall SW1.

An outer side portion 112d and an inner side portion 114d may be formed at a first side and a second side of each of the plurality of vent holes 110d, respectively. The outer side portion 112d and the inner side portion 114d may be a portion of the housing 100a adjacent to the vent holes 110d and defining the vent holes 110d. The outer side portion 112d may be a portion of the housing 100d defining the vent holes 110d outside the housing 100d, and the inner side portion 114d may be a portion of the housing 100d defining the vent holes 110a at the inner space 108 of the housing 100d. For example, the inner side portion 114d may include the inner surface 115 of the first side wall SW1 and the outer side portion 112d may include the outer surface 117 of the first side wall SW1.

In some embodiments, a first diameter HRa which is a diameter of the outer side portion 112d of each of the vent holes 110d may be greater than a second diameter HRb which is a diameter of the inner side portion 114d. In some embodiments, the vent holes 110d may inwardly extend from the outside of the housing 100 and with a decreasing diameter or height. For example, the vent holes 110d may extend from the outer surface 117 to the inner surface 115 with decreasing diameter. As used herein, diameter may mean a distance or spacing between an upper end and a lower end of the outer side portion 112d or the inner side portion 114d.

As the second diameter HRb which is an inner diameter of the vent holes 110d is smaller than the first diameter HRa which is an outer diameter, when viewing the first side wall SW1 from the outside of the housing 100d in a horizontal direction, an observer viewing the vent holes 110d from the outside of the housing 100d may observe only an inner surface of the vent holes 110d through the outer side portion 112b. Accordingly, the observer may not observe the semiconductor chip 420 located in the inner space 108 of the housing 100d through the vent holes 110d.

Referring to FIGS. 1A through 6B together, an observer may not observe the semiconductor chip 420 from the outside of the solid state drive apparatus 1 according to the inventive concept. In detail, in the solid state drive apparatus 1 according to the inventive concept, air may pass through the vent holes 110, 110a, 110b, 110c, and 110d and the connector groove 120 formed in each of the first side wall SW1 and the second side wall SW2 arranged opposite to each other, and thus, heat generated in the solid state drive apparatus 1 may be easily dissipated, and at the same time, the security effects of preventing leakage of information from the solid state drive apparatus 1 by inserting a probe from the outside of the solid state drive apparatus 1 into the vent holes 110, 110*a*, 110*b*, 110*c*, and 110*d* may be provided.

Figure 7:
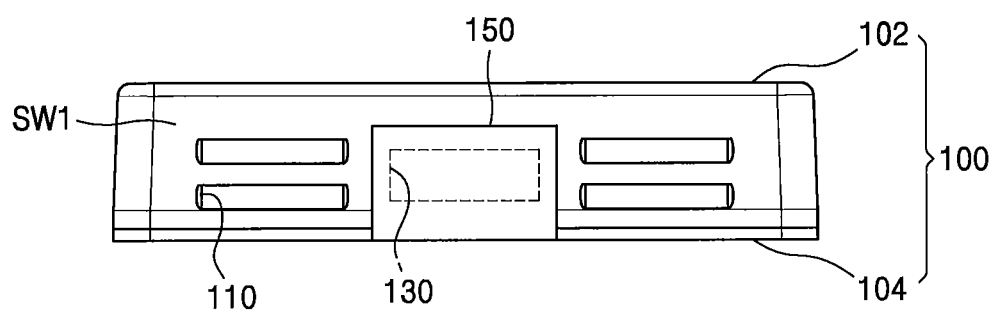
FIG. 7 is a side view of a solid state drive apparatus according to an embodiment of the inventive concept.

FIG. 7 is a side view of a solid state drive apparatus 1*a* according to an embodiment of the inventive concept.

Referring to FIG. 7, a label 150 completely covering a test groove 130 may be adhered to the first side wall SW1 of the housing 100 of the solid state drive apparatus 1*a*. In some embodiments, the label 150 may be adhered to extend from the first side wall SW1 of the housing 100 to a lower surface of the housing 100. The label 150 may be, for example, a sticker coated with an adhesive.

As the label 150 completely covers the test groove 130, the test connector 300 may not be exposed to the outside. Accordingly, leakage of information in the solid state drive apparatus 1*a* through the test connector 300 from the outside of the solid state drive apparatus 1*a* may be prevented.

In some embodiments, the label 150 may be a void label. Accordingly, after removing the label 150, if information in the solid state drive apparatus 1*a* is leaked through the test connector 300 from the outside of the solid state drive apparatus 1*a*, a portion of the label 150 may remain on a surface of the housing 100 as a void marking so that whether information is leaked or not may be determined.

Figure 8A:
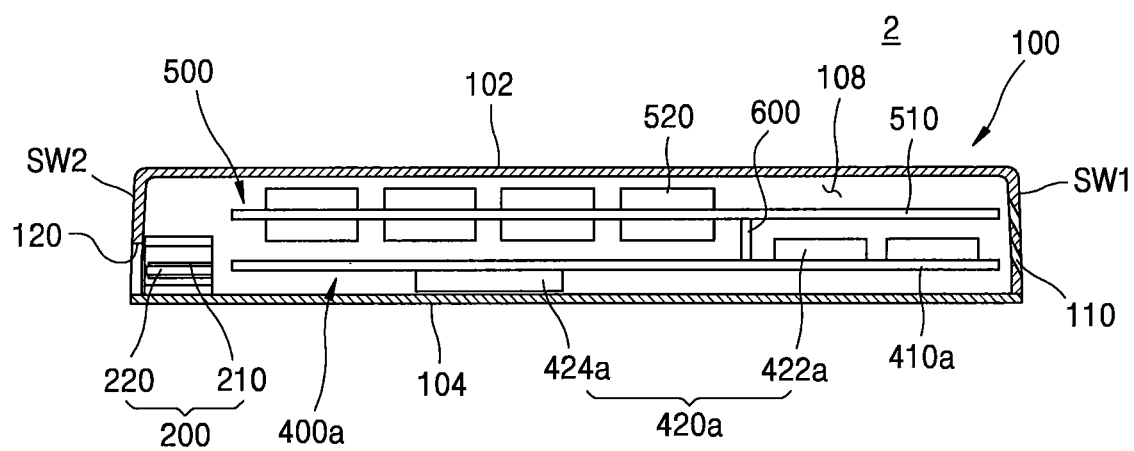
FIG. 8A is a cross-sectional view of a solid state drive apparatus according to an embodiment of the inventive concept.
Figure 8B:
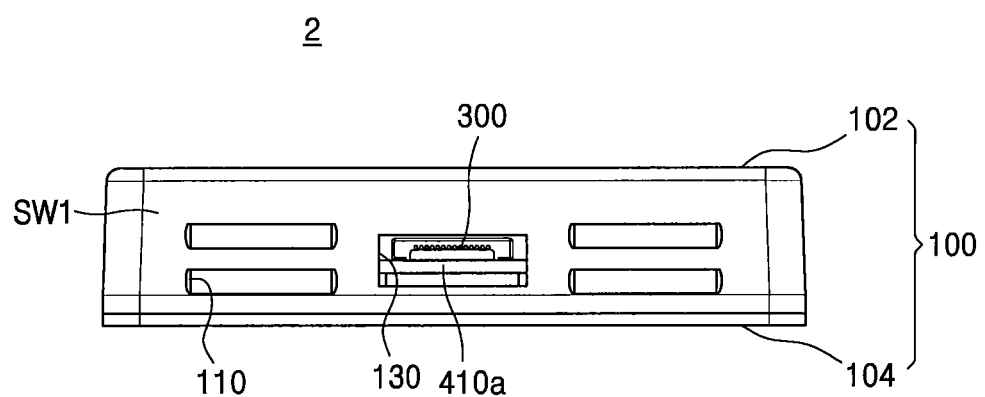
FIG. 8B is a side view of a solid state drive apparatus according to an embodiment of the inventive concept.

FIG. 8A is a cross-sectional view of a solid state drive apparatus 2 according to an embodiment of the inventive concept, and FIG. 8B is a side view of the solid state drive apparatus 2 according to an embodiment of the inventive concept.

Referring to FIGS. 8A and 8B together, the solid state drive apparatus 2 includes a housing 100 and a first package substrate module 400*a* and a second package substrate module 500 mounted in the housing 100.

The first package substrate module 400*a* may include a first package base substrate 410*a* and a plurality of first semiconductor chips 420*a* mounted on the first package base substrate 410.

The plurality of first semiconductor chips 420*a* may include a plurality of first memory semiconductor chips 422*a* and at least one controller chip 424*a*. The first package substrate module 400*a*, the first package base substrate 410*a*, the first memory semiconductor chip 422*a*, and the controller chip 424*a* are respectively similar to the package substrate module 400, the package base substrate 410, the memory semiconductor chip 422, and the controller chip 424 described with reference to FIGS. 1A through 1D, and thus detailed description thereof will be omitted.

While a location where the plurality of first semiconductor chips 420*a* are mounted in the first package substrate module 400*a* is different from that of the plurality of semiconductor chips 420 of the package substrate module 400 illustrated in FIG. 1C, the location is an example, and the inventive concept is not limited thereto. For example, the plurality of first memory semiconductor chips 422*a* may be mounted only on an upper surface of the first package base substrate 410*a*, or some of them may be mounted on each of upper and lower surfaces of the first package base substrate 410*a*. In addition, for example, at least one controller chip 424*a* may be mounted only on the upper surface of the first package base substrate 410*a* or only on the lower surface of the first package base substrate 410*a*.

The second package substrate module 500 may include a second package base substrate 510 and a plurality of second memory semiconductor chips 520 mounted on the second package base substrate 510. The second package base substrate 510 and the second memory semiconductor chips 520 are respectively similar to the first package base substrate 410 and the memory semiconductor chips 422 described with reference to FIGS. 1A through 1D, and thus detailed description thereof will be omitted. A spacer 600 may couple and space apart the first package base substrate 410*a* and the second package base substrate 510.

The second package substrate module 500 may be, for example, a DIMM in which a plurality of second memory semiconductor chips 520 are respectively mounted on upper and lower surfaces of the second package base substrate 510, but is not limited thereto. For example, the second package substrate module 500 may be a SIMM in which a plurality of second memory semiconductor chips 520 are mounted on one of the upper surface and the lower surface of the second package base substrate 510.

The housing 100 may have a plurality of vent holes or channels 110 defined in the first side wall SW1. The plurality of vent holes 110 may penetrate the first side wall SW1 and communicate the outside of the housing 100 with the inner space 108. The plurality of vent holes 110 may be formed to penetrate, for example, the upper cover 102. The plurality of vent holes 110 may be formed to extend in an oblique direction or at an oblique angle with respect to each of an upper surface of the housing 100 and a surface of the first side wall SW1. In some embodiments, the plurality of vent holes 110 may be formed to inwardly extend from the outside of the housing 100 in an oblique direction in which a level rises, but are not limited thereto. For example, the plurality of vent holes 110 may be formed to extend from the outside to the inside of the housing 100 in an oblique direction in which a level decreases.

When viewing the first side wall SW1 from the outside of the housing 100, an observer viewing the vent holes 110 from the outside of the housing 100 may observe only an inner surface of the vent holes 110 through the outer side portion 112. Accordingly, the observer may not observe the first semiconductor chip 420*a* located in the inner space 108 of the housing 100 through the vent holes 110.

Figure 9:
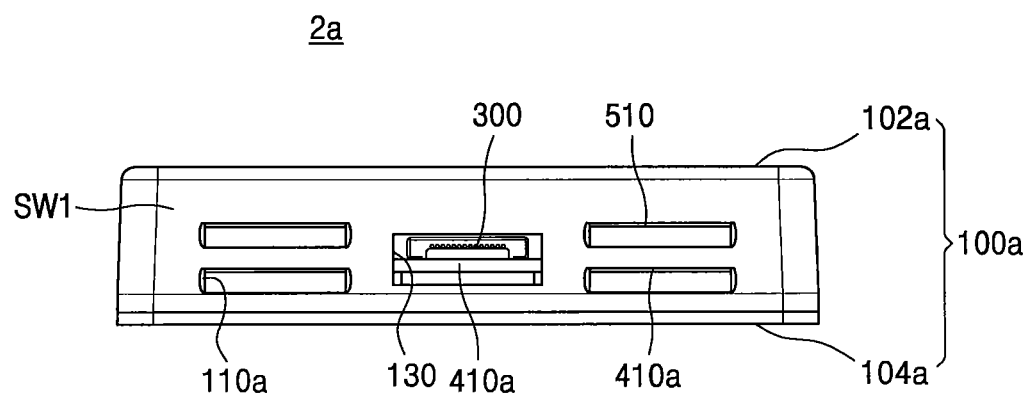
FIG. 9 is a side view of a solid state drive apparatus according to an embodiment of the inventive concept.

FIG. 9 is a side view of a solid state drive apparatus 2*a* according to an embodiment of the inventive concept.

Referring to FIG. 9, the solid state drive apparatus 2*a* includes a housing 100*a*. Similarly to the solid state drive apparatus 2 of FIG. 8A, the solid state drive apparatus 2*a* includes a first package substrate module 400*a* and a second package substrate module 500 mounted in the housing 100*a*.

The housing 100*a* may include an upper cover 102*a* and a lower cover 104*a* coupled to the upper cover 102*a*. The housing 100*a* may have a plurality of vent holes or channels 110*a* defined in the first side wall SW1. The plurality of vent holes 110*a* may penetrate the first side wall SW1 and communicate the outside of the housing 100*a* with the inner space 108. The plurality of vent holes 110*a* may be formed to penetrate, for example, the upper cover 102*a*. The plurality of vent holes 110*a* may be formed to extend in an oblique direction or at an oblique angle with respect to each of an upper surface of the housing 100*a* and a surface of the first side wall SW1. In some embodiments, the plurality of vent holes 110*a* may be formed to inwardly extend from the outside of the housing 100*a* in an oblique direction in which a level rises.

When viewing the first side wall SW1 from the outside of the housing 100*a*, an observer viewing the vent holes 110*a* from the outside of the housing 100*a* may observe a side surface of the first package base substrate 410*a* and a side surface of the second package base substrate 510 through the vent holes 110a. In detail, the observer may observe the side surface of the first package base substrate 410a through some of the plurality of vent holes 110a and the side surface of the second package base substrate 510 through the rest of the vent holes 110a.

Accordingly, the observer may not observe a first semiconductor chip 420a and a second memory semiconductor chip 520 located in the inner space 108 (see FIG. 8B) of the housing 100a through the vent holes 110a.

Figure 10:
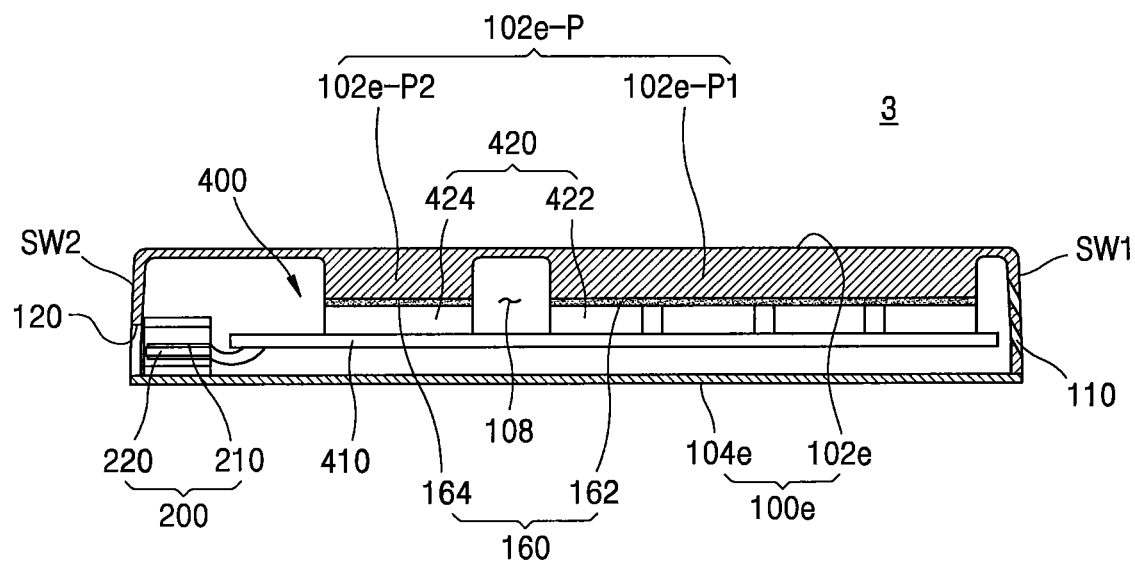
FIG. 10 is a cross-sectional view of a solid state drive apparatus according to an embodiment of the inventive concept.

FIG. 10 is a cross-sectional view of a solid state drive apparatus 3 according to an embodiment of the inventive concept.

Referring to FIG. 10, the solid state drive apparatus 3 includes a housing 100e and a package substrate module 400 mounted in the housing 100e. The housing 100e may include an upper cover 102e and a lower cover 104e coupled to the upper cover 102e.

The solid state drive apparatus 3 is similar to the solid state drive apparatus 1 described in FIGS. 1A to 1D except for the housing 100e. The lower cover 104e is similar to the lower cover 104 described with reference to FIGS. 1A to 1D, and thus detailed description thereof will be omitted.

The housing 100e may have a first side wall SW1 and a second side wall SW2 opposite to each other. The housing 100e may have a plurality of vent holes or channels 110 defined in the first side wall SW1. The plurality of vent holes 110 may be formed to penetrate, for example, the upper cover 102e. The housing 100e may have a connector groove or opening 120 in the second side wall SW2. The connector groove 120 may be formed to penetrate, for example, the upper cover 102e.

The upper cover 102e may have at least one downward protrusion or projection 102e-P. The at least one protrusion 102e-P may be disposed on a side of the upper cover 102e facing the inner space 108. In detail, a surface of the upper cover 102e facing an upper outer side may have a flat shape, and a surface of the upper cover 102e facing the inner space 108 may have a shape where the at least one protrusion 102e-P protrudes towards the package substrate module 400. The at least one protrusion 102e-P may be arranged to correspond to or align with a plurality of semiconductor chips 420.

A thermal interface material (TIM) 160 may be disposed between the at least one protrusion 102e-P and the plurality of semiconductor chips 420. The at least one protrusion 102e-P and the plurality of semiconductor chips 420 may be in thermal contact with the upper cover 102e through the TIM 160. The TIM 160 may be, for example, a gel, a pad or a particle filled epoxy formed of, for example, a grease, a thermally conductive adhesive, a mineral oil, a gap filler putty, or a phase-change material. For example, commercially available greases include ShinEtsu G750, ShinEtsu G751, ShinEtsu G765, Berquist TIC-7500; commercially available phase-change materials include Thermax HF60110-BT, Chromerics T725, Chromerics T443, Chromerics T454, Thermagon T-Berquist 200U, Berquist HiFlow 225-U, and Berquist HiFlow 225-UT; and commercially available thermally conductive adhesives include Chromerics therm-A-form T642 as thermally conductive adhesives. However, the TIM 160 is not limited to these materials The at least one protrusion 102e-P may include a first protrusion 102e-P1 corresponding to and/or above the plurality of memory semiconductor chips 422 and a second protrusion 102e-P2 corresponding to and/or above the at least one controller chip 424. The TIM 160 may include a first TIM 162 disposed between the first protrusion 102e-P1 and the plurality of memory semiconductor chips 422 and a second TIM 164 disposed between the second protrusions 102e-P2 and the at least one controller chip 424.

The number of the at least one protrusions 102e-P may be variously configured in consideration of an upper surface area and arrangement of each of the plurality of semiconductor chips 420. In some embodiments, the upper cover 102e may have one protrusion 102e-P that corresponds to the plurality of semiconductor chips 420. In some embodiments, a plurality of first protrusions 102e-P1 respectively corresponding to the plurality of memory semiconductor chips 422 may be included.

Figure 11:
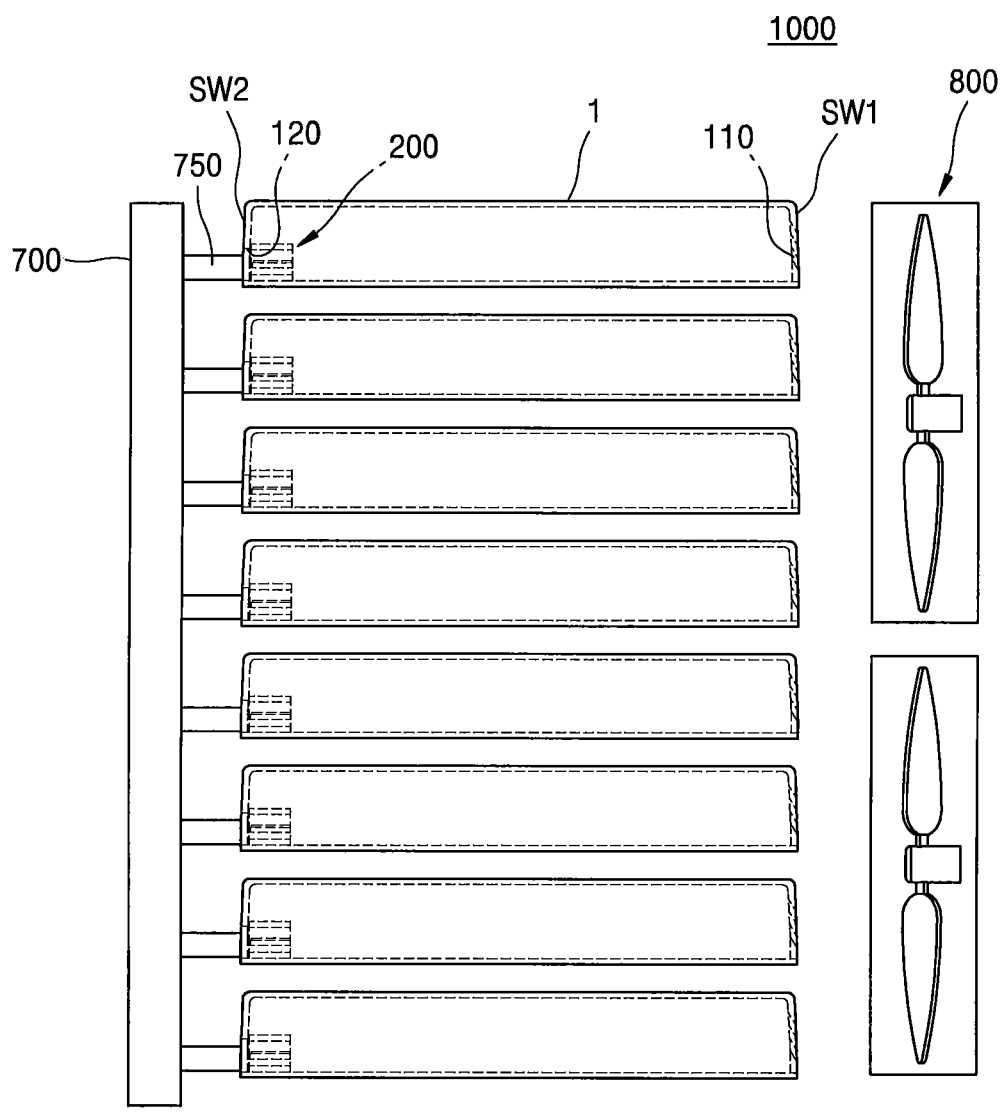
FIG. 11 is a structural diagram of a system according to an embodiment of the inventive concept.

FIG. 11 is a structural diagram of a system 1000 according to an embodiment of the inventive concept.

Referring to FIG. 11, the system 1000 includes a plurality of solid state drive apparatuses 1 connected to a main board 700 and at least one cooling fan 800. The system 1000 may be, for example, a data storage system such as Network-Attached Storage (NAS). The system 1000 may include a rack in which the plurality of solid state drive apparatuses 1 are installed, a case surrounding the plurality of solid state drive apparatuses 1 and the at least one cooling fan 800, and a power supply unit.

Each of the plurality of solid state drive apparatuses 1 may be electrically connected to the main board 700 through a signal transmission medium 750 coupled to an external connector 200. In the system 1000, a second side wall SW2 of each of the plurality of solid state drive apparatuses 1 may face the main board 700. The signal transmission medium 750 may be, for example, a film cable, a Board-to-Board (BtoB) connector, a flat flexible cable (FFC) connector, or a flexible printed circuitry (FPC) connector.

The at least one cooling fan 800 may be disposed adjacent to the first side wall SW1 of the plurality of solid state drive apparatuses 1. The at least one cooling fan 800 may form a forced convection environment in the system 1000. The flow of the air formed in the system 1000 by the at least one cooling fan 800 may be transmitted through the plurality of vent holes 110 of the first side wall SW1 of the solid state drive apparatuses 1 and into the solid state drive apparatuses 1 and then transferred to the outside of the solid state drive apparatuses 1 through the connector groove 120 of the second side wall SW2.

Accordingly, the solid state drive apparatuses 1 may be cooled by the flow of the air that is transferred into the solid state drive apparatuses 1 through the plurality of vent holes 110 of the first side wall SW1 and then transmitted to the outside through the connector groove 120 of the second side wall SW2.

Here, an observer may not observe the semiconductor chip 420 from the outside of the solid state drive apparatuses 1 through the plurality of vent holes 110. Accordingly, the security effects of preventing leakage of information from the solid state drive apparatuses 1 by inserting a probe into the vent hole 110 from outside the solid state drive apparatuses 1 may be obtained.

While the system 1000 is illustrated as including the solid state drive apparatus 1 illustrated in FIGS. 1A through 2C, the system 1000 is not limited thereto. For example, the system 1000 may include at least one of the solid state drive apparatuses 1a, 2, 2a, and 3 illustrated in FIGS. 7A through 10. The solid state drive apparatus 1 of the system 1000 is shown as having the plurality of vent holes 110 illustrated in FIGS. 1A to 2C, but is not limited thereto. The solid state drive apparatus 1 may include one of the vent holes 110a, 101b, 110c, and 110d illustrated in FIGS. 3A through 6B.

According to the solid state drive apparatus of the inventive concept, an observer may not view a semiconductor chip from the outside of the solid state drive apparatus. In detail, according to the solid state drive apparatus, the air may pass through vent holes and connector grooves in each of a first side wall and a second side wall opposite to each other, and thus, heat generated in the solid state drive apparatus may be easily discharged, and at the same time, the security effects of preventing leakage of information from the solid state drive apparatus from the outside of the solid state drive apparatus by inserting a probe into the vent holes may be obtained.

While the inventive concept has been particularly shown and described with reference to embodiments thereof, it will be understood that various changes in form and details may be made therein without departing from the spirit and scope of the following claims.

What is claimed is:

1. A solid state drive apparatus comprising:
    a housing having an inner space and a plurality of vent channels penetrating a first side wall at a first side of the housing and a connector opening penetrating a second side wall at a second side of the housing opposite the first side of the housing; and
    a package substrate module in the inner space and having a package base substrate and a plurality of semiconductor chips mounted on the package base substrate,
    wherein each of the plurality of vent channels extends inwardly from an outer surface of the first side wall to an inner surface of the first side wall such that a vertical level of at least a portion of each of the plurality of vent channels varies between the outer surface and the inner surface of the first side wall,
    wherein each of the plurality of vent channels is in communication with the inner space such that an area outside of the housing and the inner space having the package substrate module therein are in fluid communication via the plurality of vent channels, and
    wherein the plurality of semiconductor chips are not viewable through any of the plurality of vent channels to an observer viewing the plurality of vent channels from outside of the housing in a horizontal direction.

2. The solid state drive apparatus of claim 1, wherein each of the plurality of vent channels extends inwardly from the outer surface of the first side wall at an oblique angle with respect to each of an upper surface of the housing and the outer surface of the first side wall.

3. The solid state drive apparatus of claim 1, wherein the outer surface of the first side wall defines a first side of each of the plurality of vent channels and the inner surface of the first side wall defines a second side of each of the plurality of vent channels,
    wherein the vertical level of each of the plurality of vent channels increases from the outer surface of the first side wall toward the inner surface of the first side wall.

4. The solid state drive apparatus of claim 3, wherein each of the plurality of vent channels has a decreasing diameter from the outer surface of the first side wall toward the inner surface of the first side wall.

5. The solid state drive apparatus of claim 3, wherein, for at least some of the plurality of vent channels, a first vertical level of an upper end of the vent channel at the outer surface of the first side wall is equal to or lower than a second vertical level of a lower end of the vent channel at the inner surface of the first side wall.

6. The solid state drive apparatus of claim 3, wherein, for at least some of the plurality of vent channels, a first vertical level of an upper end of the vent channel at the outer surface of the first side wall is higher than a second vertical level of a lower end of the vent channel at the inner surface of the first side wall,
    wherein the second vertical level is lower than an upper surface of the package base substrate and higher than a lower surface of the package base substrate for at least some of the plurality of vent channels.

7. The solid state drive apparatus of claim 3, wherein, for at least some of the plurality of vent channels, a first vertical level of an upper end of the vent channel at the outer surface of the first side wall is higher than a second vertical level of a lower end of the vent channel at the inner surface of the first side wall,
    wherein the second vertical level is lower than an upper surface of the package base substrate and higher than a lower surface of the package base substrate for some of the plurality of vent channels, and the second vertical level is higher than an upper surface of the plurality of semiconductor chips for the rest of the plurality of vent channels.

8. The solid state drive apparatus of claim 1, wherein each of the plurality of vent channels extends inwardly from the outer surface of the housing to the inner surface of the housing in a V-shape.

9. The solid state drive apparatus of claim 1, wherein each of the plurality of vent channels includes an inner vent channel and an outer vent channel which communicate with each other, the inner vent channel extends horizontally from the inner surface of the first side wall at a first vertical level, and the outer vent channel extends horizontally from the outer surface of the first side wall at a second vertical level that is different than the first vertical level.

10. The solid state drive apparatus of claim 1, wherein each of the plurality of vent channels includes an inner vent channel and an outer vent channel which communicate with each other, the inner vent channel extends horizontally from the inner surface of the first side wall and the outer vent channel extends horizontally from the outer surface of the first side wall, and, for each of the plurality of vent channels, either (i) an upper end of the inner vent channel is at a higher vertical level than an upper end of the outer vent channel and a lower end of the inner vent channel is at a higher vertical level than a lower end of the outer vent channel or (ii) the upper end of the inner vent channel is at a lower vertical level than the upper end of the outer vent channel and the lower end of the inner vent channel is at a lower vertical level than the lower end of the outer vent channel.

11. The solid state drive apparatus of claim 1, wherein only an inner surface of each of the plurality of vent channels is viewable to an observer viewing the plurality of vent channels from outside of the housing in the horizontal direction.

12. The solid state drive apparatus of claim 1, wherein a side surface of the package base substrate is viewable through some of the plurality of vent channels.

13. A data storage system comprising:
    a main board;
    a plurality of solid state drive apparatuses each comprising a housing having an inner space and a plurality of vent holes penetrating a first side wall at a first side of the housing and a connector opening penetrating a second side wall at a second side of the housing opposite the first side of the housing, a package substrate module in the inner space and having a package base substrate and a plurality of semiconductor chips mounted on the package base substrate, wherein the second side wall faces the main board and is connected to the main board; and at least one cooling fan arranged adjacent to the first side wall of each of the plurality of solid state drive apparatuses, wherein, for each of the plurality of solid state drive apparatuses, each of the plurality of vent holes extends inwardly from an outer surface of the first side wall to an inner surface of the first side wall such that a vertical level of at least a portion of each of the plurality of vent holes varies between the outer surface and the inner surface, wherein, for each of the plurality of solid state drive apparatuses, the housing further comprises a test opening in the first side wall, the test opening penetrating the first side wall and spaced apart from each of the plurality of vent holes, and wherein the data storage system further comprises a label completely covering the test opening on the first side wall of the housing.

14. The data storage system of claim 13, wherein the label is a void label.

15. The data storage system of claim 13, wherein the plurality of semiconductor chips are not viewable through any of the plurality of the vent holes to an observer viewing the plurality of vent holes from outside of the housing in a horizontal direction.

16. A solid state drive apparatus comprising:

a housing defining an inner space and a plurality of vent channels defined in a first side wall at a first side of the housing and a connector opening defined in a second side wall at a second side of the housing opposite the first side of the housing;

a first package substrate module in the inner space and comprising a first package base substrate and a plurality of first memory semiconductor chips and at least one controller chip mounted on the first package base substrate; and a second package substrate module in the inner space and comprising a second package base substrate and a plurality of second memory semiconductor chips mounted on the second package base substrate, wherein each of the plurality of vent channels extends inwardly and upwardly from an outer surface of the first side wall to an inner surface of the first side wall, and wherein the plurality of first memory semiconductor chips, the plurality of second memory semiconductor chips, and the at least one controller chip are not viewable through any of the plurality of vent channels when viewing the plurality of vent channels from outside of the housing in a horizontal direction.

17. The solid state drive apparatus of claim 16, wherein only an inner surface of each of the plurality of vent channels is viewable when viewing the plurality of vent channels from outside of the housing in the horizontal direction.

18. The solid state drive apparatus of claim 16, wherein a side surface of the first package base substrate is viewable through some of the plurality of vent channels, and a side surface of the second package base substrate is viewable through the rest of the plurality of vent channels, when viewing the plurality of vent channels from outside of the housing in the horizontal direction.

19. The solid state drive apparatus of claim 16, wherein each of the plurality of vent channels is in communication with the inner space.

* * * * *